(12) United States Patent
Matsumoto et al.

(10) Patent No.: US 10,672,914 B2
(45) Date of Patent: Jun. 2, 2020

(54) FIELD-EFFECT TRANSISTOR AND METHOD FOR PRODUCING FIELD-EFFECT TRANSISTOR

(71) Applicant: RICOH COMPANY, LTD., Tokyo (JP)

(72) Inventors: Shinji Matsumoto, Kanagawa (JP); Naoyuki Ueda, Kanagawa (JP); Yuki Nakamura, Tokyo (JP); Mikiko Takada, Kanagawa (JP); Yuji Sone, Kanagawa (JP); Ryoichi Saotome, Kanagawa (JP); Sadanori Arae, Kanagawa (JP); Yukiko Abe, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 228 days.

(21) Appl. No.: 14/908,599

(22) PCT Filed: Jul. 25, 2014

(86) PCT No.: PCT/JP2014/070289
§ 371 (c)(1),
(2) Date: Jan. 29, 2016

(87) PCT Pub. No.: WO2015/016333
PCT Pub. Date: Feb. 5, 2015

(65) Prior Publication Data
US 2016/0190329 A1    Jun. 30, 2016

(30) Foreign Application Priority Data

Jul. 31, 2013 (JP) .................................. 2013-159290
Feb. 26, 2014 (JP) .................................. 2014-035430

(51) Int. Cl.
*H01L 29/786* (2006.01)
*H01L 27/12* (2006.01)
(Continued)

(52) U.S. Cl.
CPC ....... *H01L 29/7869* (2013.01); *G09G 3/2092* (2013.01); *H01L 27/1225* (2013.01);
(Continued)

(58) Field of Classification Search
CPC ......... H01L 29/41733; H01L 29/42384; H01L 29/45; H01L 29/4908; H01L 29/66969;
(Continued)

(56) References Cited

U.S. PATENT DOCUMENTS 8,013,329 B2 *  9/2011  Nakamura ............ H01L 51/105
                                                              257/40
8,691,621 B1 *  4/2014  Ulmer ................... H01L 51/105
                                                             257/400
(Continued)

FOREIGN PATENT DOCUMENTS

EP    2157615        2/2010
EP    2157615 B1    11/2013
(Continued)

OTHER PUBLICATIONS

Taiwanese official action dated Jun. 2, 2016 in corresponding Taiwanese Patent Application No. 103125875.
(Continued)

*Primary Examiner* — Amare Mengistu
*Assistant Examiner* — Jennifer L Zubajlo
(74) *Attorney, Agent, or Firm* — Oblon, McClelland, Maier & Neustadt, L.L.P.

(57) ABSTRACT

To provide a field-effect transistor, containing: a gate electrode configured to apply gate voltage; a source electrode and a drain electrode, both of which are configured to take out electric current; an active layer formed of a n-type oxide semiconductor, provided in contact with the source electrode and the drain electrode; and a gate insulating layer provided between the gate electrode and the active layer, wherein
(Continued)

work function of the source electrode and drain electrode is 4.90 eV or greater, and wherein an electron carrier density of the n-type oxide semiconductor is $4.0 \times 10^{17}$ cm$^{-3}$ or greater.

14 Claims, 16 Drawing Sheets

(51) Int. Cl.
| | |
|---|---|
| *G09G 3/20* | (2006.01) |
| *H01L 29/423* | (2006.01) |
| *H01L 29/49* | (2006.01) |
| *H01L 29/66* | (2006.01) |
| *H01L 29/417* | (2006.01) |
| *H01L 29/45* | (2006.01) |

(52) U.S. Cl.
CPC .. *H01L 29/41733* (2013.01); *H01L 29/42384* (2013.01); *H01L 29/45* (2013.01); *H01L 29/4908* (2013.01); *H01L 29/66969* (2013.01); *H01L 29/78696* (2013.01)

(58) Field of Classification Search
CPC ........... H01L 29/7869; H01L 29/78696; H01L 27/1225; G09G 3/2092
See application file for complete search history.

(56) References Cited

U.S. PATENT DOCUMENTS

| | | | |
|---|---|---|---|
| 2006/0113549 A1 | 6/2006 | Den et al. | |
| 2006/0124924 A1* | 6/2006 | Suh | H01L 51/002 257/40 |
| 2006/0160280 A1* | 7/2006 | Suh | H01L 51/0541 438/149 |
| 2006/0169974 A1* | 8/2006 | Ahn | H01L 51/0541 257/40 |
| 2007/0087489 A1* | 4/2007 | Park | B82Y 30/00 438/149 |
| 2007/0090351 A1* | 4/2007 | Park | H01L 51/0545 257/40 |
| 2008/0197344 A1* | 8/2008 | Yano | H01L 51/0545 257/40 |
| 2009/0134389 A1* | 5/2009 | Matsunaga | H01L 29/7869 257/43 |
| 2010/0032667 A1 | 2/2010 | Yamazaki et al. | |
| 2010/0044711 A1 | 2/2010 | Imai | |
| 2010/0059747 A1* | 3/2010 | Nakayama | H01L 29/7869 257/43 |
| 2011/0114914 A1* | 5/2011 | Numata | H01L 27/12 257/9 |
| 2011/0121284 A1* | 5/2011 | Yamazaki | H01L 29/42392 257/43 |
| 2011/0121288 A1* | 5/2011 | Yamazaki | H01L 29/78642 257/43 |
| 2011/0128275 A1 | 6/2011 | Ueda et al. | |
| 2011/0133191 A1* | 6/2011 | Yamazaki | H01L 29/78696 257/57 |
| 2011/0193081 A1 | 8/2011 | Godo et al. | |
| 2011/0233526 A1* | 9/2011 | Chen | C07D 471/04 257/40 |
| 2012/0021250 A1* | 1/2012 | Lee | B82Y 30/00 428/688 |
| 2012/0131092 A1 | 5/2012 | Kawamura et al. | |
| 2012/0293201 A1 | 11/2012 | Fujita et al. | |
| 2012/0298971 A1* | 11/2012 | Lee | H01L 51/0045 257/40 |
| 2012/0298974 A1* | 11/2012 | Lee | H01L 51/105 257/40 |
| 2012/0313092 A1 | 12/2012 | Shieh et al. | |
| 2013/0181214 A1* | 7/2013 | Yamazaki | H01L 29/78696 257/43 |
| 2013/0200336 A1* | 8/2013 | Vaidyanathan | H01L 51/0043 257/40 |
| 2014/0009514 A1* | 1/2014 | Abe | H01L 29/78693 345/690 |
| 2014/0027762 A1* | 1/2014 | Tsurume | H01L 29/24 257/43 |
| 2014/0183457 A1* | 7/2014 | Stecker | H01L 51/0562 257/40 |
| 2014/0353648 A1* | 12/2014 | Abe | H01L 29/247 257/40 |

FOREIGN PATENT DOCUMENTS

| | | | | |
|---|---|---|---|---|
| JP | 2007-134496 | | 5/2007 | |
| JP | 2010-062546 | | 3/2010 | |
| JP | 2010-074148 | | 4/2010 | |
| JP | 2010-283190 | | 12/2010 | |
| JP | 2011-009619 | | 1/2011 | |
| JP | 2011009619 A | * | 1/2011 | ............. H01L 29/45 |
| JP | 2011009619 A | * | 1/2011 | ......... H01L 29/7869 |
| JP | 2011-103402 | | 5/2011 | |
| JP | 2011103402 A | * | 5/2011 | |
| JP | 2011103402 A | * | 5/2011 | |
| JP | 5118811 | | 10/2012 | |
| JP | 2012-216780 | | 11/2012 | |
| JP | 2012216780 A | * | 11/2012 | ............. C01F 11/04 |
| JP | 2012216780 A | * | 11/2012 | ....... H01L 29/78693 |
| JP | 2013-004555 | | 1/2013 | |
| JP | 2013-009318 | | 1/2013 | |
| JP | WO 2013081169 A1 | * | 6/2013 | ........... H01L 29/247 |
| TW | 2012/03545 A1 | | 1/2012 | |
| WO | WO 2011/058885 A1 | | 5/2011 | |
| WO | WO2011/096275 | | 6/2011 | |
| WO | WO2012/170160 | | 12/2012 | |
| WO | WO2013/081169 A | | 6/2013 | |
| WO | WO-2013081169 A1 | * | 6/2013 | ........... H01L 29/247 |
| WO | WO2013/108630 | | 7/2013 | |

OTHER PUBLICATIONS

Korean official action (and English translation thereof) dated Jun. 19, 2017 in connection with corresponding Korean patent application No. 10-2016-7005170.
Singapore Office Action dated May 4, 2016 in connection with corresponding Singapore patent application No. 11201600543Y.
International Search Report dated Oct. 26, 2014 for counterpart International Patent Application No. PCT/JP2014/070289 filed Jul. 25, 2014.
Indian Office Action dated Nov. 28, 2019 in Patent Application No. 201637003872 (with English translation), 7 pages.

\* cited by examiner

Light

Light

FIELD-EFFECT TRANSISTOR AND METHOD FOR PRODUCING FIELD-EFFECT TRANSISTOR

TECHNICAL FIELD

The present invention relates to a field-effect transistor, and a method for producing the field-effect transistor.

BACKGROUND ART

Developments of an active matrix display device (e.g., a liquid crystal display device, a luminescent display device, and an electrophoretic display device), in which a switching element formed of a thin film transistor (TFT) that is a field-effect transistor (FET) is provided per display pixel arranged in the formed matrix have been recently actively conducted.

In these developments, focused is a technology that a TFT is produced using an oxide semiconductor film, which has high carrier mobility and give less variation between elements, in the channel formation region of the TFT, and the TFT is applied for an electronic device, or an optic device. For example, disclosed is the FET using zinc oxide (ZnO), $In_2O_3$, or In—Ga—Zn—O, as an oxide semiconductor film (see, for example, PTL 1).

As for a field-effect transistor used for a device, demanded is the one, which has high field-effect mobility, high on/off ratio, and a small absolute value of turn-on voltage.

A display device, which display in a large area, has a problem of a signal delay from lines to channels of TFTs due to resistance. As for a material of an electrode of the TFT, therefore, demanded is use of a material having low specific resistance.

When a display device using TFT is produced, a display element is laminated on top of the formed TFT. In the process performed after the formation of the TFT, therefore, a heating treatment, or an oxidizing atmosphere treatment is performed. For this reason, it is desirable to use an electrode material that does not cause deterioration through the heat treatment or oxidizing atmosphere treatment performed after the formation of the TFT.

PTL 1 discloses that a range of a carrier density of an oxide semiconductor film (e.g., an IGZO film) suitable as a channel of a semiconductive layer is $1\times10^{11}$ $cm^{-3}$ or greater but lower than $1\times10^{18}$ $cm^{-3}$, preferably $1\times10^{14}$ $cm^{-3}$ or greater but lower than $1\times10^{17}$ $cm^{-3}$, more preferably $1\times10^{15}$ $cm^{-3}$ or greater but lower than $1\times10^{16}$ $cm^{-3}$.

This is because large electric current may passed through between a source electrode and a drain electrode with no gate voltage of a transistor applied when an oxide the electron carrier density of which is $1\times10^{18}$ $cm^{-3}$ or greater is used as a channel of TFT, and the TFT may become a normally-on TFT. In order to produce a normally-off TFT applicable for an image display device, such as a luminescent device, it has been widely known that an oxide having an electron carrier density of lower than $1\times10^{18}$ $cm^{-3}$ is used as a channel of the TFT.

Proposed preferable carrier density of an oxide semiconductor layer (IGZO) used for a channel is less than $1\times10^{17}$ $cm^{-3}$ (see, for example, PTL 2). This is because a resulting thin film transistor may become a normally-on type if the carrier density is greater than the aforementioned range. Moreover, disclosed is a method where an oxide electroconductive material having higher carrier density than an oxide semiconductor layer as a buffer layer between a source-drain electrode layer and the oxide semiconductor layer, for the purpose of reducing contact resistance between the oxide semiconductor layer, and the source-drain electrode layer. This is because contact resistance may become large, when a material having low specific resistance (e.g. gold), which is desirable as lines or electrodes, is used as a source electrode and a drain electrode. In the case where a buffer layer is not provided, a metal having low work function, such as Al, Mo, and Ti, is typically used as an electrode in a TFT using a n-type oxide semiconductor as an active layer, in order to improve electric contact between the active layer and the source and drain electrodes. However, the metal having low work function has a problem that the metal is oxidized during a heat treatment or oxidizing atmosphere treatment performed after the formation of a field-effect transistor to increase a specific resistance.

Moreover, disclosed is to obtain a field-effect transistor, which has high mobility and reliability, by controlling an electron carrier density n ($cm^{-3}$) in the range of $10^{18}<n<10^{20}$ (see, for example, PTL 3). In the disclosed method, a structure composed of titanium (Ti)/gold (Au)/titanium (Ti) is used as source and drain electrodes.

Moreover, disclosed is to obtain a thin film transistor having a high field-effect mobility by controlling an electron carrier density n ($cm^{-3}$) in the range of $n\leq5\times10^{18}$ (see, for example, PTL 4). In the disclosed method, gold (Au) formed into a film by sputtering is used as source and drain electrodes.

Moreover, disclosed is a method, in which a semiconductor layer, and an electrode layer are formed by coating (see, for example, PTL 5). As for the method for forming the semiconductor layer of TFT using oxide semiconductor, or source-drain electrode layer, vacuum deposition, or sputtering is commonly used. In order to perform any of these methods, however, there is a problem that a complicated and expensive device is necessary. Moreover, another problem is that it is difficult to form a thin film of a large area. Accordingly, a method for forming a semiconductor layer or an electrode layer through coating is expected as a method that enables to form a film of a large area with a simple manner.

A n-type oxide semiconductor tends to exhibits higher mobility, as an electron carrier density is higher. Therefore, there is a possibility that higher on-current is attained, as an electron carrier density is higher, when the n-type oxide semiconductor is used for a field-effect transistor.

In the conventional art, however, a field-effect transistor, which has a source electrode and a drain electrode having high resistance to heat treatment and oxidizing atmosphere treatment performed after the formation of the field-effect transistor, and having low specific resistance, does not require a buffer layer, has high field-effect mobility, has high an on/off ratio, and has a small absolute value of turn-on voltage, has not been provided even in the case where the electron carrier density of the n-type oxide semiconductor is high.

Accordingly, there is currently a need for a field-effect transistor, which has a source electrode and a drain electrode having high resistance to heat treatment and oxidizing atmosphere treatment performed after the formation of the field-effect transistor, and having low specific resistance, does not require a buffer layer, has high field-effect mobility, has high an on/off ratio, and has a small absolute value of turn-on voltage, even in the case where the electron carrier density of the n-type oxide semiconductor is high.

CITATION LIST

Patent Literature

PTL 1: Japanese Patent (JP-B) No. 5118811
PTL 2: Japanese Patent Application Laid-Open (JP-A) No. 2010-62546
PTL 3: JP-A No. 2011-103402
PTL 4: JP-A No. 2013-4555
PTL 5: JP-A No. 2010-283190

SUMMARY OF INVENTION

Technical Problem

The present invention aims to solve the aforementioned various problems in the art, and to achieve the following object. Specifically, the object of the present invention is to provide a field-effect transistor, which has a source electrode and drain electrode that are highly resistant to a heating process and oxidizing atmosphere processing performed after formation of a field-effect transistor, even when a carrier density of a n-type oxide semiconductor is high, and have low specific resistance, and which does not require a buffer layer, which has high a field-effect mobility, high on/off ratio, and a small absolute value of turn-on voltage, even in the case where the electron carrier density of the n-type oxide semiconductor is high.

Solution to Problem

The means for solving the aforementioned problems are as follows.

The field-effect transistor of the present invention contains:

a gate electrode configured to apply gate voltage;

a source electrode and a drain electrode, both of which are configured to take out electric current;

an active layer formed of a n-type oxide semiconductor, provided in contact with the source electrode and the drain electrode; and a gate insulating layer provided between the gate electrode and the active layer, wherein work function of the source electrode and the drain electrode is 4.90 eV or greater, and wherein an electron carrier density of the n-type oxide semiconductor is $4.0 \times 10^{17}$ cm$^{-3}$ or greater.

Advantageous Effects of Invention

The present invention can solve the aforementioned various problems in the art, and can provide a field-effect transistor, which has a source electrode and drain electrode that are highly resistant to a heating process and oxidizing atmosphere processing performed after formation of a field-effect transistor, even when a carrier density of a n-type oxide semiconductor is high, and have low specific resistance, and which does not require a buffer layer, which has high a field-effect mobility, high on/off ratio, and a small absolute value of turn-on voltage, even in the case where the electron carrier density of the n-type oxide semiconductor is high.

DESCRIPTION OF EMBODIMENTS

Field-Effect Transistor

Figure 1:
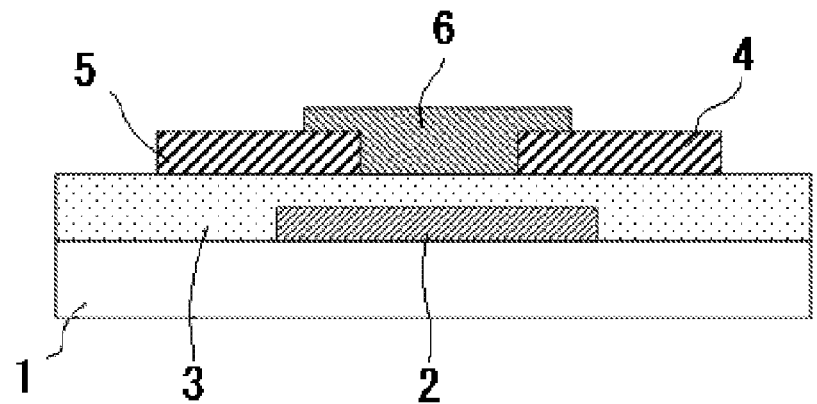
FIG. 1 is a schematic cross-sectional view illustrating one example of a bottom gate/bottom contact field-effect transistor.

The field-effect transistor of the present invention contains at least a gate electrode, a source electrode, a drain electrode, an active layer, and a gate insulating layer, and may further contain other members, according to the necessity.

The field-effect transistor of the present invention can be produced, for example, by the method for producing the field-effect transistor according to the present invention.

In the aforementioned JP-B No. 5118811 and JP-A No. 2010-62546, disclosed is a technique for realizing a normally-off transistor operation by controlling an electron carrier density of an oxide semiconductor layer to a range of $1\times10^{11}$ cm$^{-3}$ to $1\times10^{18}$ cm$^{-3}$. In JP-B No. 5118811, gold is used for source-drain terminals, but an In—Ga—Zn—O amorphous film having a large electroconductivity is introduced between an oxide semiconductor layer that will be a channel, and the gold.

As a result of the researches conducted by the present inventors, it has been confirmed that sufficient transistor operation cannot be attained with a TFT, in which an active layer formed of an oxide semiconductor film, the carrier density of which is in the range of $1\times10^{15}$ cm$^{-3}$ or greater but less than $1\times10^{16}$ cm$^{-3}$ which is disclosed as a preferable range in JP-B No. 5118811, and source and drain electrodes formed of gold are directly connected. The reason for this is as follows. In the case where a metal having high work function, such as gold, is brought into contact with a n-type oxide semiconductor having low work function, Schottky barrier junction is formed at a contact interface, and as a result, it is considered that resistance becomes high.

In JP-A No. 2011-103402, it is disclosed that a field-effect transistor having high mobility and reliability can be attained by controlling the electron carrier density n (cm$^{-3}$) in the range of $10^{18}<n<10^{20}$, and using titanium (Ti)/gold (Au)/titanium (Ti) for source and drain electrodes. In this transistor, the plane at the side of the electrode in the contact area between the active layer of the oxide semiconductor, and the source and drain electrodes is titanium.

As a result of the researches conducted by the present inventors, however, it has been confirmed that a high on/off ration cannot be attained with a field-effect transistor using an oxide semiconductor having the electron carrier density of $1\times10^{18}$ cm$^{-3}$ or greater, and titanium for the source and drain electrodes. Since the metal having low work function, i.e., titanium, is brought into contact with the oxide semiconductor, electric contact between the oxide semiconductor and the electrodes is excellent. However, a high on/off ratio cannot be attained from the reasons disclosed in JP-B No. 5118811, and JP-A No. 2010-62546.

In JP-A No. 2010-283190, disclosed is a TFT, in which a source electrode and a drain electrode are formed by applying Ag nano particles through an inkjet method.

As a result of the researches conducted by the present inventors, however, a TFT using an oxide semiconductor film having the carrier density in the range of $1\times10^{15}$ cm$^{-3}$ or greater but less than $1\times10^{16}$ cm$^{-3}$, which is disclosed as a more preferable range, and source and drain electrodes formed by coating Ag nano particles has poor electric conduct between the oxide semiconductor and the electrodes, and cannot attain high field-effect mobility (may be referred as "carrier mobility" hereinafter). A thin film, which is formed by coating followed by baking, and has low specific resistance, is typically silver (Ag) or gold (Au). There has not been yet a technology where a metal material, such as Al, Mo, and Ti, is formed into an ink, and is applied as the ink, followed by baking, to thereby form a thin film.

Other than the metal material, as for an electroconductive material that can be formed into a film by coating, typically known is, for example, tin-doped indium oxide (ITO). However, the specific resistance of the ITO film formed by coating is higher than that of the film formed by a vacuum process. In a display device, in which a display of a large area is presented, a delay of a signal due to resistance from lines to channel of the TFT becomes significant. Therefore, it is not sufficient to apply as an electrode material of TFT.

The present inventors have researched as follow based on the result of the researches associated with the conventional art.

The present inventors produced a field-effect transistor, where Mg—In based oxide semiconductor was used as a n-type oxide semiconductor, and Al was used as a source electrode and a drain electrode, and conducted an experiment for confirming the transistor characteristics. The electron carrier density of the Mg—In based oxide semiconductor was measured by the below-mentioned hall effect measurement device, and the result was $5.9\times10^{15}$ cm$^{-3}$.

Figure 8:
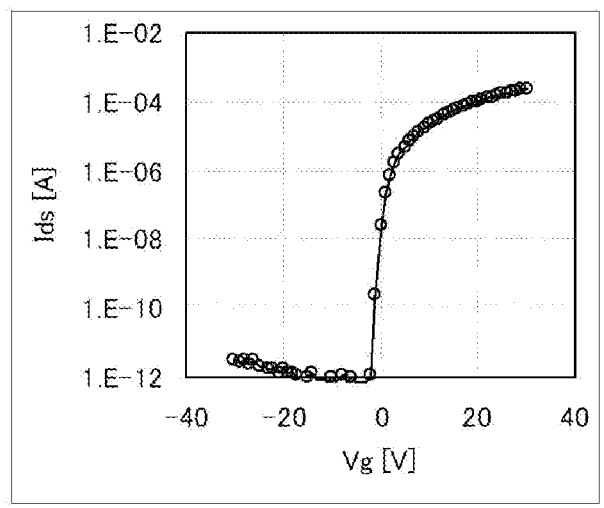
FIG. 8 is a diagram depicting current-voltage characteristics of the field-effect transistor using a Mg—In based oxide semiconductor thin film (electron carrier density: $5.9 \times 10^{15}$ cm$^{-3}$) as a n-type oxide semiconductor, and Al as a source electrode and drain electrode.

FIG. 8 is a diagram depicting current-voltage characteristics of a bottom gate/top contact field-effect transistor, and shows a relationship between the gate voltage Vg and the source-drain electric current Ids with the source-drain voltage Vds of 20 V. The field-effect mobility calculated in the saturated region was 4.6 cm$^2$/Vs. Moreover, a ratio (on/off ratio) of the source-drain electric current in the on-state (e.g., Vg=20V) of the transistor to that in the off-state (e.g., Vg=−20 V) was $5.9\times10^7$. Moreover, the gate voltage (turn-on voltage) at which the source-drain electric current was turned to increase was Vg=−2 V.

Figure 9:
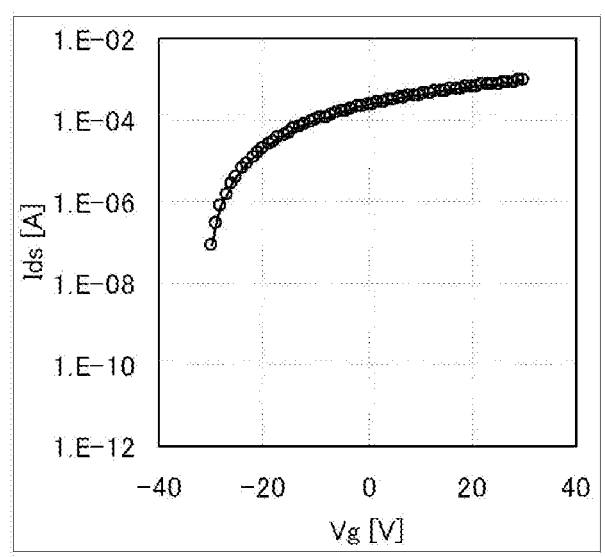
FIG. 9 is a diagram depicting current-voltage characteristics of the field-effect transistor using a Mg—In based oxide semiconductor thin film (electron carrier density: $1.0 \times 10^{18}$ cm$^{-3}$) as a n-type oxide semiconductor, and Al as a source electrode and drain electrode.

FIG. 9 depicts the results of the measurements of the current-voltage characteristics of the produced bottom gate/top contact field-effect transistor where the electron carrier density of the Mg—In based oxide semiconductor is $1.0\times10^{18}$ cm$^{-3}$. When the gate voltage was in the range of −30V to +30V, the transistor was not turned into a clear off state. The ratio of the source-drain current with Vg=20 V to that with Vg=−20 V was $3.3\times10^1$.

In the case where the electron carrier density of the oxide semiconductor is $1\times10^{15}$ cm$^{-3}$ to $1\times10^{16}$ cm$^{-3}$, and the metal having low work function is used as source and drain electrodes, as described above, transistor characteristics that the field-effect mobility is high, the on/off ratio is high, and the absolute value of the turn-on voltage is small can be attained.

When the electron carrier density is $1.0\times10^{18}$ cm$^{-3}$ or greater, on the other hand, the transistor characteristics that the on/off ratio is small, and the absolute value of the turn-on voltage is large are obtained.

The transistor having the performance as depicted in FIG. 8 can be suitably used for an active matrix display device in view of the performance, but the Al electrode is deteriorated when a heat treatment and oxidizing atmosphere treatment are performed after the formation of the transistor, and as a result, the deterioration of the transistor performance is confirmed.

Therefore, the present inventors produced a field-effect transistor using gold as source and drain electrodes, and conducted an experiment to confirm the transistor characteristics of the produced field-effect transistor.

Figure 6:
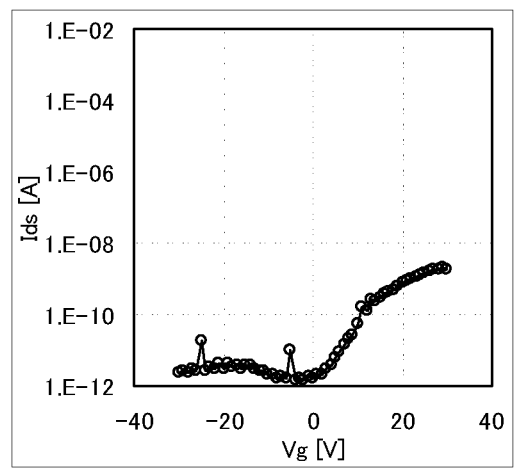
FIG. 6 is a diagram depicting current-voltage characteristics of the field-effect transistor of Comparative Example 1 with the carrier density of $5.9 \times 10^{15}$ cm$^{-3}$.
Figure 7:
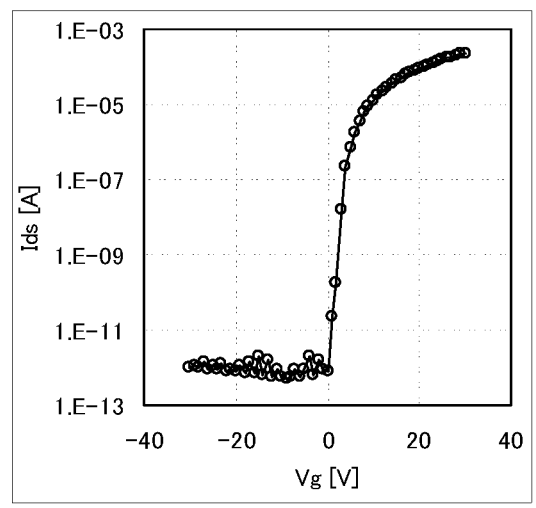
FIG. 7 is a diagram depicting current-voltage characteristics of the field-effect transistor of Example 1 with the carrier density of $1.0 \times 10^{18}$ cm$^{-3}$.

FIG. 6 (the case where the carrier density is $5.9 \times 10^{15}$ cm$^{-3}$ in Comparative Example 1) and FIG. 7 (the case where the carrier density is $1.0 \times 10^{18}$ cm$^{-3}$ in Example 1) are diagrams depicting current-voltage characteristics of the field-effect transistor using gold as the source and drain electrode, with the electron carrier density of the Mg—In based oxide semiconductor being $5.9 \times 10^{15}$ cm$^{-3}$, and $1.0 \times 10^{18}$ cm$^{-3}$ respectively.

It can be understood from FIG. 6 that the on-current is low, i.e., about $1 \times 10^{-9}$ A, and the transistor hardly operates, when the electron carrier density is in the range of $1 \times 10^{15}$ cm$^{-3}$ to $1 \times 10^{16}$ cm$^{-3}$, which is considered to be more suitably used as a transistor using a n-type oxide semiconductor, and gold is used as source and drain electrode. This is because Schottky barrier junction is formed at a plane where the gold having a relatively high work function and the n-type oxide semiconductor are in contact, and thus contact resistance becomes large.

When gold is used as source and drain electrode with the electron carrier density of $1 \times 10^{18}$ cm$^{-3}$ or greater, which has been conventionally considered as a range that is not suitably used for a transistor using a n-type oxide semiconductor, on the other hand, it has been found from FIG. 7 that the transistor characteristics that the field-effect mobility is high, i.e., 5.6 cm$^2$/Vs, the ratio (on/off ratio) of the source-drain current with Vg=20 V to that with Vg=−20 V is high, i.e., $4.7 \times 10^8$, and the absolute value of the turn-on voltage is small, i.e., Vg=1.0 V.

The transistors depicted in FIGS. 6 to 9 exhibited desirable performances due to a combination with the electron carrier density of the n-type oxide semiconductor and the gold, as the material of the source and drain electrode and the electron carrier density are varied.

Furthermore, the present inventors have conducted an experiment to determine the work function of a metal formed by vacuum deposition, such as sputtering, and vacuum vapor deposition, and the work function of a metal formed by applying nanoparticles. As a result, it has been found that the work function of the metal thin film indicated a different value depending on the film forming method, and the metal formed by applying nanoparticles has a higher work function than that of the metal formed by vacuum deposition, even through they are identical metal.

For example, the present inventors have conducted an experiment to determine work functions of gold (Au), and silver (Ag) formed by vacuum deposition, and work functions of gold (Au), and silver (Ag) formed by applying nanoparticles or an organometallic compound. As a result, the work functions of the gold (Au), and silver (Ag) formed by vacuum deposition are respectively 4.70 eV to 4.79 eV, and 4.80 eV to 4.83 eV. On the other hand, the work functions of the gold (Au), and silver (Ag) formed by applying nanoparticles or an organometallic compound are respectively 4.90 eV to 5.10 eV, and 5.05 eV to 5.30 V. It has been found that the metal formed by applying nanoparticles or an organometallic compound has a higher work function than the metal formed by vacuum deposition.

As a result of further researches conducted based on the aforementioned results, it has been found that a field-effect transistor, which has a source electrode and a drain electrode having high resistance to a heat treatment and oxidizing atmosphere treatment performed after the formation of the field-effect transistor, and having low specific resistance, does not require a buffer layer, has a high electric-field mobility, high on/off ratio, and a small absolute value of the turn-on voltage, can be provided when the work function of the source electrode and drain electrode is 4.90 eV or greater, and the electron carrier density of the n-type oxide semiconductor is $4.0 \times 10^{17}$ cm$^{-3}$ or greater.

Moreover, it has been found that a field-effect transistor, in which a source electrode and a drain electrode are both formed by applying nano particles or an organometallic compound (e.g., Au, Ag, Ag/Pd, and Pt) has a high field-effect mobility, high on/off ratio, and a small absolute value of the turn-on voltage, even when the electron carrier density of the n-type oxide semiconductor is greater than $5.0 \times 10^{18}$ cm$^{-3}$.

<Gate Electrode>

The gate electrode is appropriately selected depending on the intended purpose without any limitation, provided that it is an electrode configured to apply gate voltage.

A material of the gate electrode is appropriately selected depending on the intended purpose without any limitation, and examples thereof include: a metal, such as platinum, palladium, gold, silver, copper, zinc, aluminum, nickel, chromium, tantalum, molybdenum, and titanium; alloys of the aforementioned metals; and a mixture of the aforementioned metals. Moreover, further examples thereof include: an electroconductive oxide, such as indium oxide, zinc oxide, tin oxide, gallium oxide, niobium oxide, tin (Sn)-doped In$_2$O$_3$ (ITO), gallium (Ga)-doped ZnO, aluminum (Al)-doped ZnO, and antimony (Sb)-doped SnO$_2$; a composite compound thereof; and a mixture thereof.

The average thickness of the gate electrode is appropriately selected depending on the intended purpose without any limitation, but the average thickness thereof is preferably 10 nm to 200 nm, more preferably 50 nm to 100 nm.

<Gate Insulating Layer>

The gate insulating layer is appropriately selected depending on the intended purpose without any limitation, provided that it is an insulating layer formed between the gate electrode and the active layer.

A material of the gate insulating layer is appropriately selected depending on the intended purpose without any limitation, and examples thereof include an inorganic insulating material, and an organic insulating material.

Examples of the inorganic insulating material include silicon oxide, aluminum oxide, tantalum oxide, titanium oxide, yttrium oxide, lanthanum oxide, hafnium oxide, zirconium oxide, silicon nitride, aluminum nitride, and a mixture thereof.

Examples of the organic insulating material include polyimide, polyamide, polyacrylate, polyvinyl alcohol, and a novolak resin.

The average thickness of the gate insulating layer is appropriately selected depending on the intended purpose without any limitation, but the average thickness thereof is preferably 50 nm to 1,000 nm, more preferably 100 nm to 500 nm.

<Source Electrode and Drain Electrode>

The source electrode and the drain electrode are electrodes configured to take out electric current.

The work function of the source electrode and the drain electrode is 4.90 eV or greater.

As the work function of the source electrode and the drain electrode is 4.90 eV or greater, the resistance of the source electrode and drain electrode to the heat treatment or oxidizing atmosphere treatment performed after the formation of the field-effect transistor becomes high, and the specific resistance of the source electrode and the drain electrode is maintained low.

A material of the source electrode and the drain electrode is preferably a metal, an alloy, or both. Here, the phrase "a metal, an alloy, or both" does not exclude to contain impurities to a degree that does not adversely affect the work function and the specific resistance.

Examples of the metal include gold, silver, palladium, platinum, nickel, iridium, and rhodium.

The alloy includes those exhibiting metallic conductivity, and composed of a plurality of metal elements, or a combination of a metal element and a non-metal element, and examples thereof include a solid solution, eutectic crystal, and an intermetallic compound.

The alloy is preferably an alloy of a plurality of metals selected from the group consisting of gold, silver, palladium, platinum, nickel, iridium, and rhodium.

The source electrode and the drain electrode may be each formed by electrically connecting a plurality of the metals, a plurality of the alloys, or a combination of a single or plurality of the metal and a single or plurality of the alloys.

The source electrode and the drain electrode are preferably formed by baking metal particles, alloy particles, an organometallic compound, or any combination thereof.

Examples of the metal particles include gold particles, silver particles, palladium particles, platinum particles, nickel particles, iridium particles, and rhodium particles.

Examples of the alloy particles include particles formed of any of the aforementioned alloys. For example, the alloy particles are silver-palladium alloy particles.

The alloy particles may have a core-shell structure, or layered structure, formed of a plurality of the aforementioned metals.

The metal particles and the alloy particles may contain a surfactant or a dispersing agent for improving dispersibility of the particles in a solvent, as long as it does not adversely affect the obtainable effect of the present invention. Moreover, the metal particles and the alloy particles may contain a protective agent for improving storage stability when the particles are dispersed in a solvent.

The source electrode and the drain electrode may be each formed by electrically connecting a plurality of the metal particles, a plurality of the alloy particles, or a combination of a single or plurality of the metal particles, and a single or plurality of the alloy particles.

The organometallic compound is appropriately selected depending on the intended purpose without any limitation, provided that it is a compound containing the metal and an organic group. The term "organometallic compound" indicates, in a narrow sense, a compound containing a metal-carbon bond. In the present specification, however, in addition to the metal-carbon bond, the term "organometallic compound" also includes a compound, in which the metal and an organic group are bonded through a covalent bond, an ionic bond, or a coordinate bond.

Examples of the metal-carbon bond include a metal-carbonyl bond, a metal-alkyl bond, and a metal-olefin bond. Examples of the organic group bonded to the metal through the metal-carbon bond include a carbonyl group, an alkyl group, an alkenyl group, and an alkynyl group.

Examples of the organic group bonded to the metal through the covalent bond include an alkoxy group.

Examples of the organic group bonded to the metal through the ionic bond include organic acid, such as carboxylic acid, and octylic acid.

Examples of the organic group bonded to the metal through the coordinate bond include an acetylacetonato group, and a thiolate group.

Examples of the organometallic compound include a metal acetylide compound, metal alkoxide, metal carboxylate, and a metal thiolate complex.

The source electrode and the drain electrode are preferably formed by applying a coating liquid containing metal particles, alloy particles, an organometallic compound, or any combination thereof in a droplet ejecting system, and baking the metal particles, the alloy particles, the organometallic compound, or any combination thereof. Examples of the droplet ejecting system include an inkjet system.

—Coating Liquid—

The coating liquid is appropriately selected depending on the intended purpose without any limitation, provided that the coating liquid contains the metal particles, the alloy particles, the organometallic compound, or any combination thereof. The coating liquid is preferably a coating liquid containing gold particles, silver particles, silver-palladium alloy particles, palladium particles, platinum particles, nickel particles, iridium particles, rhodium particles, the organometallic compound, or any combination thereof.

Shapes of the metal particles and the alloy particles are appropriately selected depending on the intended purpose without any limitation, and examples thereof include spherical shapes, ellipsoidal shapes, and polyhedral shapes. Among them, spherical shapes are preferable. Note that, the spherical shapes are not limited to spheres.

The average particle diameter of the metal particles or alloy particles is appropriately selected depending on the intended purpose without any limitation, but the upper limit thereof is preferably 1 µm or smaller, more preferably 500 nm or smaller, and particularly preferably 100 nm or smaller. The lower limit of the average particle diameter is preferably 1 nm or greater, more preferably 5 nm or greater.

It is known that metal nano particles can be typically sintered at temperature that is significantly lower than the melting point of the bulk metal, when the average particle diameter thereof is several nanometers to several ten nanometers. An effect for lowering baking temperature is expected by setting the average particle diameter to the range of 1 nm to 10 nm. In the case where the source electrode and the drain electrode are formed using a droplet ejecting system, such as inkjet, it is considered that the small average particle size can contribute to prevention of clogging of a nozzle.

The coating liquid may contain an organic solvent. Examples of the organic solvent include: hydrocarbon, such as tetradecane; cyclic hydrocarbon, such as cyclohexane, and cyclododecene; aromatic hydrocarbon, such as toluene, xylene, and mesitylene; glycol ether, such as diethylene glycol monoethyl ether; monoalcohol ether, such as ethylene glycol monomethyl ether; polyhydric alcohol, such as ethylene glycol, and propylene glycol; and monoalcohol, such as butanol. These may be used alone, or in combination.

The work function of the source electrode and the drain electrode is 4.90 eV or greater, preferably 5.00 eV or greater. When the work function is less than 4.90 eV, it is difficult to stably realize a high on/off ratio and a small absolute value of the turn-on voltage with a high electron carrier density. The upper limit of the work function is appropriately selected depending on the intended purpose without any limitation, but the work function is preferably 6.00 eV or less.

A measurement of the work function can be carried out, for example, by means of a photoelectron spectrometer in air AC-2 (manufactured by RIKEN KEIKI Co., Ltd.).

The average thickness of the source electrode and the drain electrode is appropriately selected depending on the intended purpose without any limitation, but the average thickness thereof is preferably 10 nm to 500 nm, more preferably 50 nm to 200 nm.

<Active Layer>

The active layer is provided in contact with the source electrode and the drain electrode.

The active layer is formed of a n-type oxide semiconductor.

The electron carrier density of the n-type oxide semiconductor is $4.0 \times 10^{17}$ cm$^{-3}$ or greater, preferably $1.0 \times 10^{18}$ cm$^{-3}$ or greater, more preferably $5.1 \times 10^{18}$ cm$^{-3}$ or greater, and particularly preferably $7.5 \times 10^{18}$ cm$^{-3}$ or greater. The upper limit of the electron carrier density is appropriately selected depending on the intended purpose without any limitation, but the electron carrier density is preferably $1.0 \times 10^{20}$ cm$^{-3}$ or lower, more preferably $5.0 \times 10^{19}$ cm$^{-3}$ or lower.

When the electron carrier density is lower than $4.0 \times 10^{17}$ cm$^{-3}$, a resulting field-effect transistor cannot attain excellent transistor characteristics.

When the electron carrier density is greater than $1.0 \times 10^{20}$ cm$^{-3}$, it is difficult to attain a high on/off ratio, and a small absolute value of turn-on voltage.

The electron carrier density can be measured, for example, by means of a hall effect measurement device.

The hall effect is a phenomenon that a electromotive force is generated in the direction transverse to both electric current and a magnetic field as the magnetic field vertical to the electric current is applied, and is used to mainly identify a carrier density, mobility, and a carrier type of a semiconductor.

Examples of the hall effect measurement device include a specific resistance/hall effect measurement system ResiTest8300 (manufactured by TOYO Corporation).

The n-type oxide semiconductor is appropriately selected depending on the intended purpose without any limitation, provided that it has the electron carrier density of $4.0 \times 10^{17}$ cm$^{-3}$ or greater. However, the n-type oxide semiconductor preferably contains indium, zinc, tin, gallium, titanium, or any combination thereof.

Examples of the n-type oxide semiconductor include ZnO, SnO$_2$, In$_2$O$_3$, TiO$_2$, and Ga$_2$O$_3$. Moreover, an oxide containing a plurality of metals, such as In—Zn based oxide, In—Sn based oxide, In—Ga based oxide, Sn—Zn based oxide, Sn—Ga based oxide, Zn—Ga based oxide, In—Zn—Sn based oxide, In—Ga—Zn based oxide, In—Sn—Ga based oxide, Sn—Ga—Zn based oxide, In—Al—Zn based oxide, Al—Ga—Zn based oxide, Sn—Al—Zn based oxide, In—Hf—Zn based oxide, and In—Al—Ga—Zn based oxide, can be also used.

The n-type oxide semiconductor preferably contains indium, zinc, tin, gallium, titanium, or any combination thereof, and an alkaline earth metal, as high field-effect mobility is attained, and the electron carrier density is easily controlled appropriately. It is more preferred that the n-type oxide semiconductor contain indium and an alkaline earth metal.

Examples of the alkaline earth metal include beryllium, magnesium, calcium, strontium, barium, and radium.

Indium oxide changes its electron carrier density in the range of about $10^{18}$ cm$^{-3}$ to about $10^{20}$ cm$^{-3}$ depending on an amount of oxygen defect. It should be noted that indium oxide tends to cause oxygen defects, and there is a case where unintentional oxygen defects may be formed in a later step after formation of an oxide semiconductor film. Formation of oxide mainly from two metals that are indium, and an alkaline earth metal, which is more easily bonded to oxygen than indium, is particularly preferable, because formation of unintentional oxygen defects can be prevented, and an electron carrier density is appropriately controlled, as a composition of the oxide is easily controlled.

The electron carrier density of the active layer can be controlled to an appropriate range by elements for constituting the active layer, production process conditions, and a post treatment performed after forming the active layer.

The average thickness of the active layer is appropriately selected depending on the intended purpose without any limitation, but the average thickness thereof is preferably 1 nm to 200 nm, more preferably 2 nm to 100 nm.

Figure 2:
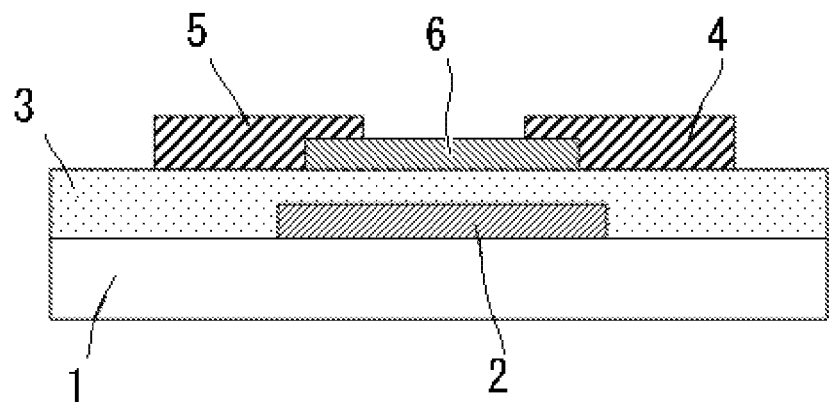
FIG. 2 is a schematic cross-sectional view illustrating one example of a bottom gate/top contact field-effect transistor.
Figure 3:
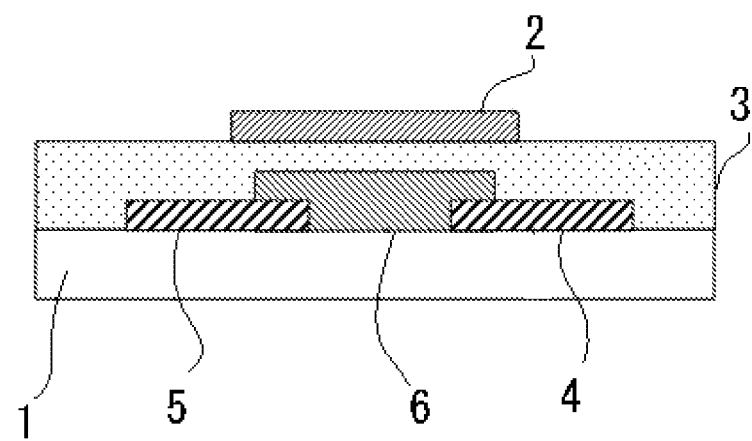
FIG. 3 is a schematic cross-sectional view illustrating one example of a top gate/bottom contact field-effect transistor.
Figure 4:
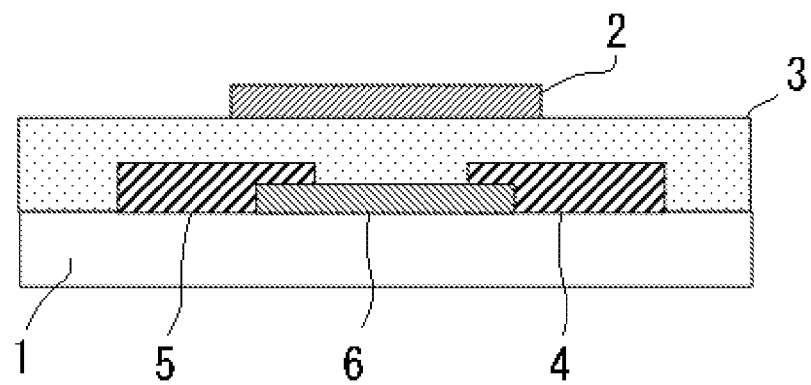
FIG. 4 is a schematic cross-sectional view illustrating one example of a top gate/top contact field-effect transistor.

A structure of the field-effect transistor is appropriately selected depending on the intended purpose without any limitation, and examples thereof include a bottom gate/bottom contact type (FIG. 1), a bottom gate/top contact type (FIG. 2), a top gate/bottom contact type (FIG. 3), and a top gate/top contact type (FIG. 4).

In FIGS. 1 to 4, 1 is a base, 2 is a gate electrode, 3 is a gate insulating layer, 4 is a source electrode, 5 is a drain electrode, and 6 is an active layer.

The field-effect transistor does not require a buffer layer, as the carrier density thereof is $4.0 \times 10^{17}$ cm$^{-3}$ or greater, and thus contact resistance at a contact surface between the oxide semiconductor and the source electrode and drain electrode does not become large.

The field-effect transistor of the present invention is suitably used as a pixel driving circuit of a liquid crystal display, an organic EL display, or an electrochromic display, or a field-effect transistor for a logic circuit.

(Method for Producing Field-Effect Transistor)

<First Production Method>

The method for forming a field-effect transistor according to the present invention (first production method) contains at least a source electrode and drain electrode forming step, and may further contain other steps, such as a gate electrode forming step, a gate insulating layer forming step, and an active layer forming step, according to the necessity.

The method for forming the field-effect transistor is a method for forming the field-effect transistor of the present invention.

<<Gate Electrode Forming Step>>

The gate electrode forming step is appropriately selected depending on the intended purpose without any limitation, provided that it is a step containing forming a gate electrode on the base. Examples thereof include: (i) a step containing, after forming a film through sputtering or dip coating, patterning the film through photolithography; and (ii) a step containing directly forming a film of a desired shape through a printing process, such as inkjet printing, nano imprinting, and gravure printing.

—Base—

A shape, structure, and size of the base are appropriately selected depending on the intended purpose without any limitation.

A material of the base is appropriately selected depending on the intended purpose without any limitation, and examples thereof include a glass base, and a plastic base.

The glass base is appropriately selected depending on the intended purpose without any limitation, and examples thereof include non-alkali glass, and silica glass.

The plastic base is appropriately selected depending on the intended purpose without any limitation, and examples thereof include polycarbonate (PC), polyimide (PI), polyethylene terephthalate (PET), and polyethylene naphthalate (PEN). Note that, a pre-treatment, such as oxygen plasma, UV ozone, and UV radiation washing, is preferably performed on the base to clean a surface thereof and to improve adhesion with another layer.

<<Gate Insulating Layer Forming Step>>

The gate insulating layer forming step is appropriately selected depending on the intended purpose without any limitation, provided that it is a step containing forming a gate insulating layer on the gate electrode. Examples thereof include: (i) a step containing, after forming a film through sputtering or dip coating, patterning the film through photolithography; and (ii) a step containing directly forming a film of a desired shape through a printing process, such as inkjet printing, nano imprinting, and gravure printing.

<<Source Electrode and Drain Electrode Forming Step>>

The source electrode and drain electrode forming step is a step containing applying a coating liquid containing metal particles, alloy particles, an organometallic compound, or any combination thereof on the gate insulating layer, and baking the metal particles, the alloy particles, the organometallic compound, or any combination thereof, to thereby form a source electrode and a drain electrode.

As a result of the source electrode and drain electrode forming step, a source electrode and a drain electrode are formed at least on the gate insulating layer with a space between the source electrode and the drain electrode.

A method for the applying is appropriately selected depending on the intended purpose without any limitation, and examples thereof include screen printing, roller coating, dip coating, spin coating, inkjet printing, and nano imprinting.

When inkjet printing or nano imprinting is used as the application method, the coating liquid can be applied at room temperature. By heating a base to be coated (e.g., the gate insulating layer) to a range of about 25° C. to about 50° C., wetting and spreading of the coating liquid on a surface of the base to be coated can be prevented just after the deposition of the coating liquid.

After the applying, drying and baking are preferably carried out.

The drying is appropriately selected depending on the intended purpose without any limitation, provided that it is performed under the conditions that can remove volatile components in the coating liquid. Note that, it is not necessary to completely remove the volatile component through the drying, as long as the volatile components are removed to the degree that baking is not adversely affected.

The temperature of the baking is appropriately selected depending on the intended purpose without any limitation, provided that it is equal to or lower than the thermal deformation temperature of a base to be coated. The temperature of the baking is preferably 180° C. to 600° C.

The atmosphere of the baking is appropriately selected depending on the intended purpose without any limitation, and examples thereof include atmosphere containing oxygen, such as oxygen, and air. Moreover, the atmosphere of the baking may be inert gas, such as nitrogen gas.

The duration of the baking is appropriately selected depending on the intended purpose without any limitation.

<<Active Layer Forming Step>>

The active layer forming step is appropriately selected depending on the intended purpose without any limitation, provided that it is a step containing forming an active layer formed of a n-type oxide semiconductor at least on the gate insulating layer that will be a channel region. Examples thereof include: physical vapor deposition (physical vapor growth) such as sputtering, and pulsed laser deposition (PLD); chemical vapor deposition, such as plasma CVD; a solution coating method, such as a sol-gel method; and other conventional film forming methods. Examples of the patterning method of the active layer include a method using a shadow mask, a method using photolithography, and a method containing directly forming a film of an desired shape through printing or inkjet printing.

As the active layer forming step, and the source electrode and drain electrode forming step are carried out, the active layer is formed between the source electrode and the drain electrode.

When physical vapor deposition, such as sputtering, is used, an amount of oxygen in the n-type oxide semiconductor can be controlled with an amount of oxygen in the film forming atmosphere. In the case where electron carriers are generated by oxygen defects of the n-type oxide semiconductor, the electron carrier density of the n-type oxide semiconductor can be increased by lowering the oxygen amount of the film forming atmosphere.

Moreover, the oxygen content in the film can be controlled by carrying out a heating treatment after forming the n-type oxide semiconductor. In this case, the electron carrier density of the n-type oxide semiconductor can be controlled to the predetermined value by adjusting heating temperature, heating duration, heating speed, cooling speed, and atmosphere (fractions of gas, pressure) for heating.

When a wet process, such as a solution coating method, is used, the electron carrier density in the n-type oxide semiconductor can be controlled to the predetermined value by adjusting conditions of a heat treatment performed after coating, specifically, baking temperature, baking duration, heating speed, cooling speed, and atmosphere (fractions of bas, pressure) for baking. Moreover, the electron carrier density can be controlled by further carrying out a heat treatment after baking.

In the first production method, an order for carrying out the source electrode and drain electrode forming step, and the active layer forming step is not restricted. The active layer forming step may be performed after the source electrode and drain electrode forming step. Alternatively, the source electrode and drain electrode forming step may be performed after the active layer forming step.

When the active layer forming step is performed after the source electrode and drain electrode forming step in the first production method, a bottom gate/bottom contact field-effect transistor can be produced.

When the source electrode and drain electrode forming step is performed after the active layer forming step in the first production method, a bottom gate/top contact field-effect transistor can be produced.

A production method of a bottom gate/top contact field-effect transistor is explained hereinafter with reference to FIGS. 5A to 5D.

Figure 5A:
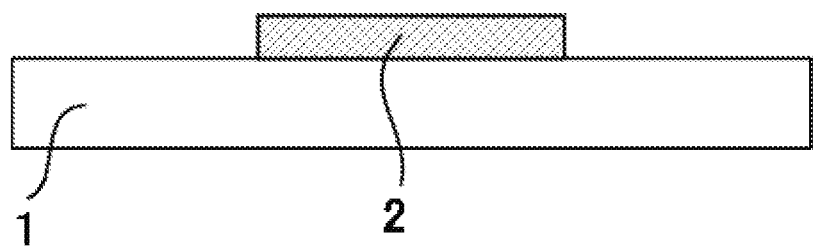
FIG. 5A is a schematic cross-sectional view illustrating one example of a method of producing a field-effect transistor according to the present invention (part 1).

First, an electroconductor film formed of aluminum is formed on a base 1 formed of a glass substrate by sputtering, and the formed electroconductor film is patterned by etching, to thereby form a gate electrode 2 (FIG. 5A).

Figure 5B:
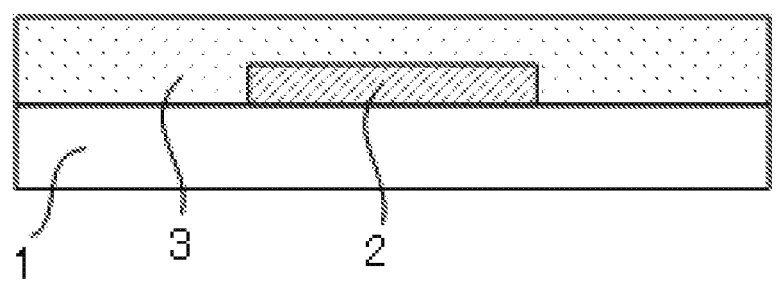
FIG. 5B is a schematic cross-sectional view illustrating one example of a method of producing a field-effect transistor according to the present invention (part 2).

Subsequently, a gate insulating layer 3 formed of $SiO_2$ is formed on the gate electrode 2 and the base 1 by sputtering to cover the gate electrode 2 (FIG. 5B).

Figure 5C:
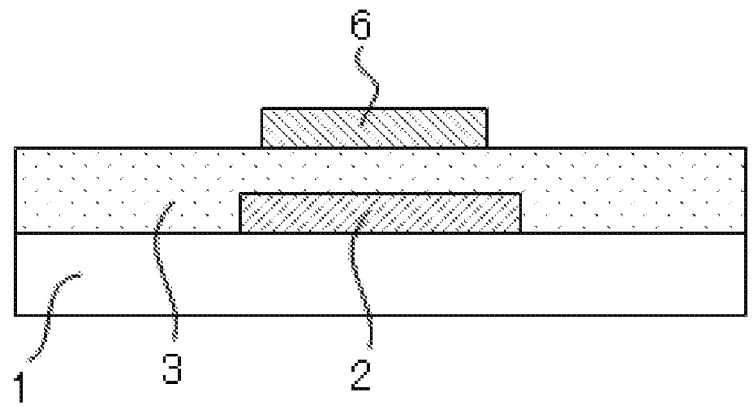
FIG. 5C is a schematic cross-sectional view illustrating one example of a method of producing a field-effect transistor according to the present invention (part 3).

Then, a n-type oxide semiconductor film is formed on the gate insulating layer 3 by sputtering, and the formed oxide semiconductor film is patterned by etching, to thereby form an active layer 6 (FIG. 5C).

Figure 5D:
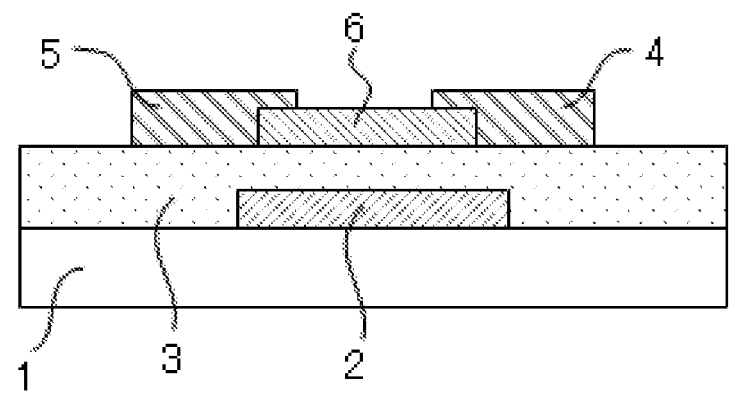
FIG. 5D is a schematic cross-sectional view illustrating one example of a method of producing a field-effect transistor according to the present invention (part 4).

Subsequently, a coating liquid containing metal particles, alloy particles, an organometallic compound, or any combination thereof is applied by a droplet ejecting system, such as an inkjet system to cover part of the active layer 6, followed by performing a heat treatment, to thereby form a source electrode 4 and a drain electrode 5 (FIG. 5D).

In the manner as described above, a field-effect transistor is produced.

<Second Production Method>

A method for producing a field-effect transistor according to the present invention (second production method) contains at least a source electrode and drain electrode forming step, and may further contain other steps according to the necessity.

The method for producing a field-effect transistor (second production method) is a method for producing the field-effect transistor of the present invention.

<<Source Electrode and Drain Electrode Forming Step>>

The source electrode and drain electrode forming step is applying a coating liquid containing metal particles, alloy particles, an organometallic compound, or any combination thereof at least onto a base, and baking the metal particles, the alloy particles, the organometallic compound, or any combination thereof, to thereby form a source electrode and a drain electrode.

As a result of the source electrode and drain electrode forming step, a source electrode and a drain electrode are formed at least on the base with a space between the source electrode and the drain electrode.

—Base—

The base is appropriately selected depending on the intended purpose without any limitation, and examples thereof include those listed as the base in the first production method.

Examples of the source electrode and drain electrode forming step include methods listed as the source electrode and drain electrode forming step in the first production method.

<<Active Layer Forming Step>>

The active layer forming step is appropriately selected depending on the intended purpose without any limitation, provided that it contains forming an active layer formed of a n-type oxide semiconductor at least on the base that will be a channel region.

Examples of the active layer forming step include methods listed as the active layer forming step in the first production method.

As the active layer forming step, and the source electrode and drain electrode forming step are carried out, the active layer is formed between the source electrode and the drain electrode.

<<Gate Insulating Layer Forming Step>>

The gate insulating layer forming step is appropriately selected depending on the intended purpose without any limitation, provided that is contains forming an gate insulating layer on the active layer. Examples thereof include methods listed as the gate insulating layer forming step in the first production method.

<<Gate Electrode Forming Step>>

The gate electrode forming step is appropriately selected depending on the intended purpose without any limitation, provided that it contains forming a gate electrode on the gate insulating layer. Examples thereof include methods listed as the gate electrode forming step in the first production method.

In the second production method, an order for carrying out the source electrode and drain electrode forming step, and the active layer forming step is not restricted. The active layer forming step may be performed after the source electrode and drain electrode forming step. Alternatively, the source electrode and drain electrode forming step may be performed after the active layer forming step.

When the active layer forming step is performed after the source electrode and drain electrode forming step in the second production method, a top gate/bottom contact field-effect transistor can be produced.

When the source electrode and drain electrode forming step is performed after the active layer forming step in the second production method, a top gate/top contact field-effect transistor can be produced.

In accordance with the field-effect transistor of the present invention, the electron carrier density of the n-type oxide semiconductor is high ($4.0 \times 10^{17}$ cm$^{-3}$ or greater), and the work function of the source and drain electrodes in contact with the n-type oxide semiconductor is 4.90 eV or greater. Therefore, the field-effect transistor of the present invention can achieve high field-effect mobility, a high on/off ratio, and a small absolute value of turn-on voltage.

Since the work function of the source and drain electrodes is 4.90 eV or greater in the field-effect transistor of the present invention, the electrodes are not oxidized by a heat treatment or oxidizing atmosphere treatment performed after the formation of the field-effect transistor, and the field-effect transistor the properties of which do not deteriorate can be attained. Moreover, use of a metal having low specific resistance as an electrode material can keep the resistance of the lines low, and thus does not cause a problem of signal delay.

Moreover, it is not necessary to provide a step for introducing a buffer layer at a contact interface between a n-type oxide semiconductor and source and drain electrode for improving electric contact between the n-type oxide semiconductor and the source and drain electrodes, and the source and drain electrodes and lines can be formed with the identical material. Therefore, the production process is simple.

Moreover, the source and drain electrodes having the work function of 4.90 eV or greater can be formed as a thin film having a low specific resistance by applying a coating liquid containing metal particles, alloy particles, an organometallic compound, or any combination thereof, followed by baking. Therefore, a printing process, such as a droplet ejecting system (e.g., an inkjet system) can be applied for a production process of the field-effect transistor, and thus a production method, which is simple and can form a film of a large area, can be selected.

(Display Element)

The display element of the present invention contains at least a light control element, and a driving circuit configured to drive the light control element, may further contain other members, according to the necessity.

<Light Control Element>

The light control element is appropriately selected depending on the intended purpose without any limitation, provided that it is a element configured to control light output according to a driving signal. Examples thereof include an electroluminescent (EL) element, an electrochromic (EC) element, a liquid crystal element, an electrophoretic element, and an electrowetting element.

<Driving Circuit>

The driving circuit is appropriately selected depending on the intended purpose without any limitation, provided that it contains the field-effect transistor of the present invention.

<Other Members>

Other members are appropriately selected depending on the intended purpose without any limitation.

Since the display element contains the field-effect transistor of the present invention, high speed drive is realized, service life thereof is long, and variations between the elements can be reduced. Even when a change in the display element occurs with time, a driving transistor can be operated at constant gate electrode.

(Image Display Device)

The image display device of the present invention contains at least a plurality of display elements, a plurality of lines, and a display control device, and may further contain other members, according to the necessity.

<Plurality of Display Elements>

The plurality of the display elements are appropriately selected depending on the intended purpose without any limitation, provided that they are a plurality of the display elements of the present invention that are arranged in a matrix form.

<Plurality of Lines>

A plurality of the lines are appropriately selected depending on the intended purpose without any limitation, provided that they are capable of individually applying gate voltage and image data signal to each field-effect transistor in the display elements.

<Display Control Device>

The display control device is appropriately selected depending on the intended purpose without any limitation, provided that it can individually control gate voltage and signal voltage of each field-effect transistor according to image data through the lines.

<Other Members>

Other members are appropriately selected depending on the intended purpose without any limitation.

Since the image display device contains the display element of the present invention, variations between the elements can be reduced, and a large-screen image of high quality can be displayed.

(System)

The system of the present invention contains at least the image display device of the present invention, and an image data generating device.

The image data generating device is configured to generate an image data based on image information to be displayed, and output the generated image data to the image display device.

Since the system is equipped with the image display device of the present invention, image information can be highly precisely displayed.

The display element, image display device, and system of the present invention are explained with reference to the drawings hereinafter.

Figure 10:
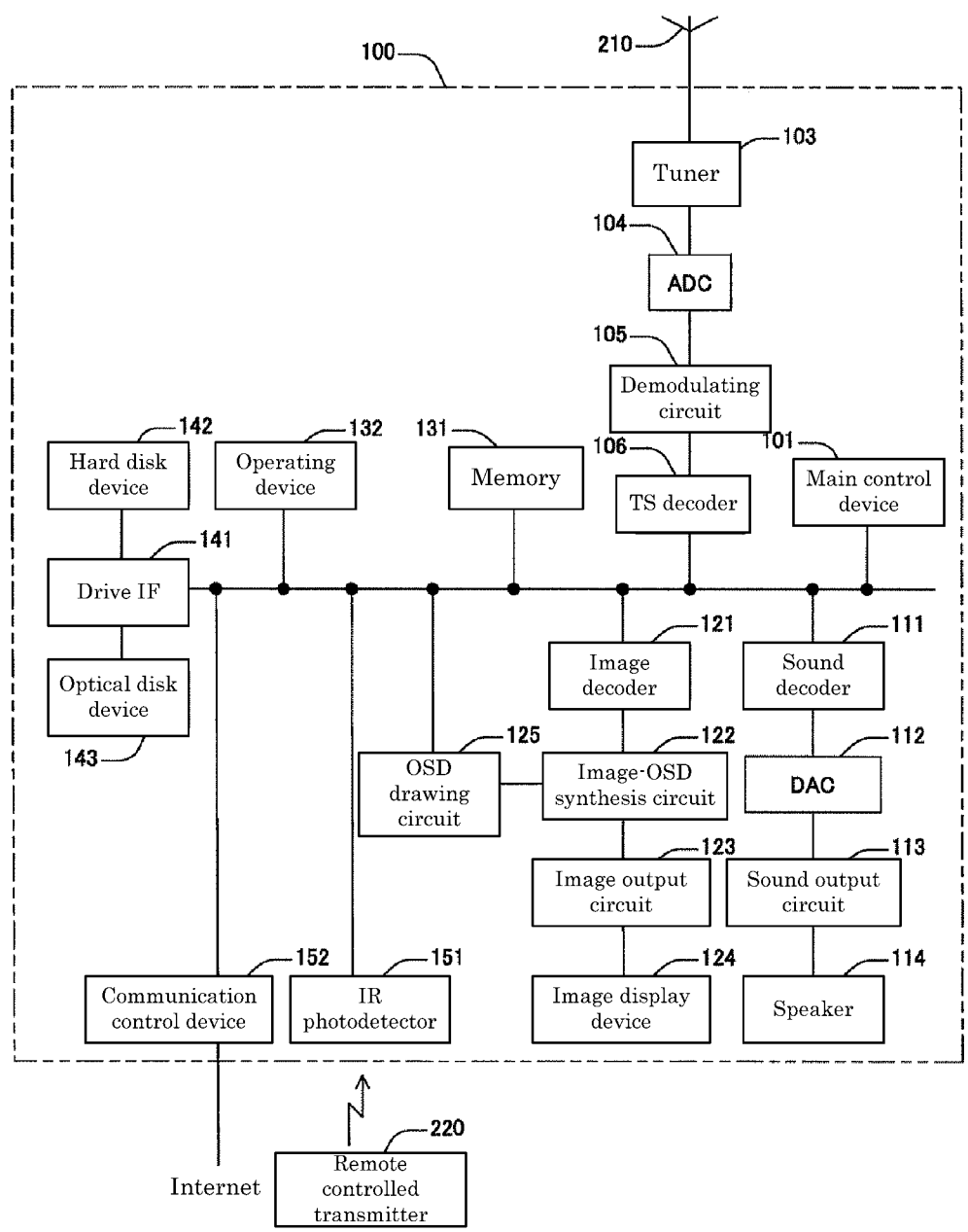
FIG. 10 is a schematic diagram illustrating one example of a television device as the system of the present invention.

First, a television device is explained as the system of the present invention with reference to FIG. 10.

In FIG. 10, a television device 100 is equipped with a main control device 101, a tuner 103, an AD converter (ADC) 104, a demodulating circuit 105, a TS (Transport Stream) decoder 106, a sound decoder 111, a DA converter (DAC) 112, a sound output circuit 113, a speaker 114, an image decoder 121, an image-OSD synthesis circuit 122, an image output circuit 123, an image display device 124, an OSD drawing circuit 125, a memory 131, an operating device 132, a drive interface (a drive IF) 141, a hard disk device 142, an optical disk device 143, an IR photodetector 151, and a communication control unit 152.

The image decoder 121, the image-OSD synthesis circuit 122, the image output circuit 123, and the OSD drawing circuit 125 constitute the image data generating device.

The main control device 101 is composed of CPU, flash ROM, and RAM, and is configured to control the entire television device 100.

In the flash ROM, a program written with a code that can be decoded with the CPU, and various data used for processing in the CPU are stored.

Moreover, RAM is a memory for operations.

The tuner 103 is configured to select channels, which have been set in advance, from the broadcast wave received by an aerial 210.

The ADC 104 is configured to convert the output signal (analog information) of the tuner 103 into digital information.

The demodulating circuit 105 is configured to demodulate the digital information from the ADC 104.

The TS decoder 106 is configured to TS decode the output signal of the demodulating circuit 105 to separate into sound information and image information.

The sound decoder 111 is configured to decode the sound information from the TS decoder 106.

The DA converter (DAC) 112 is configured to convert the output signal of the sound decoder 111 into analog signal.

The sound output circuit 113 is configured to output the output signal of the DA converter (DAC) 112 to the speaker 114.

The image decoder 121 is configured to decode the image information from the TS decoder 106.

The image-OSD synthesis circuit 122 is configured to synthesize an output signal of the image decoder 121 and an output signal of the OSD drawing circuit 125.

The image output circuit 123 is configured to output the output signals of the image-OSD synthesis circuit 122 to the image display device 124.

The OSD drawing circuit 125 is equipped with a character generator to display characters or graphics on a screen of the image display device 124, and is configured to generate a signal including display information based on the instructions from the operating device 132 and the IR photodetector 151.

The memory 131 is configured to temporarily store audio-visual (AV) data.

The operating device 132 is equipped with an input medium (not illustrated), such as a control panel, and is configured to inform various information, which has been input by a user, to the main control device 101.

The drive IF 141 is an interactive communication interface. As one example, the drive IF is according to AT attachment packet interface (ATAPI).

The hard disk device 142 is composed of a hard disk, and a driving device configured to drive the hard disk. The driving device records data on the hard disk, as well as reproducing the data recorded in the hard disk.

The optical disk device 143 records data on an optical disk (e.g., DVD), as well as reproducing the data recorded on the optical disk.

The IR photodetector 151 receives photosignal from a remote-controlled transmitter 220, and reports to the main control device 101.

The communication control unit 152 controls communication with internet. Various types of information can be obtained via internet.

Figure 11:
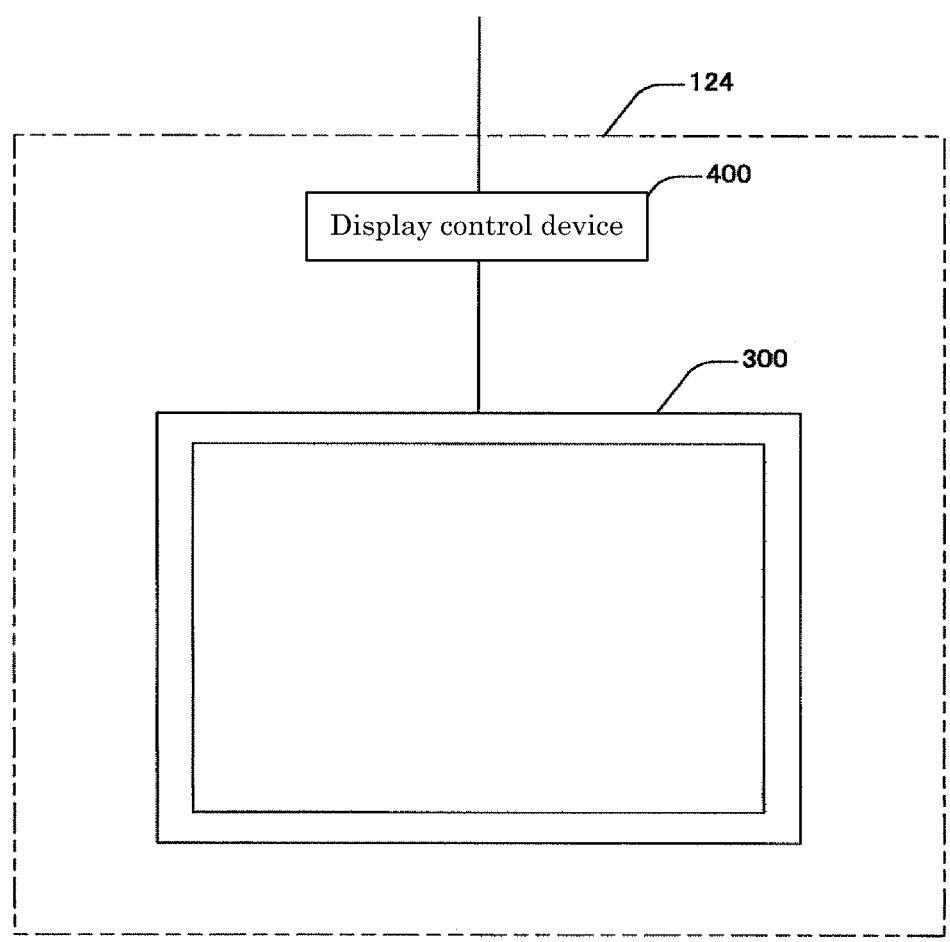
FIG. 11 is a diagram (part 1) for explaining the image display device of FIG. 10.

FIG. 11 is a schematic diagram illustrating one example of the image display device of the present invention.

FIG. 11, the image display device 124 contains a display unit 300, and a display control device 400.

Figure 12:
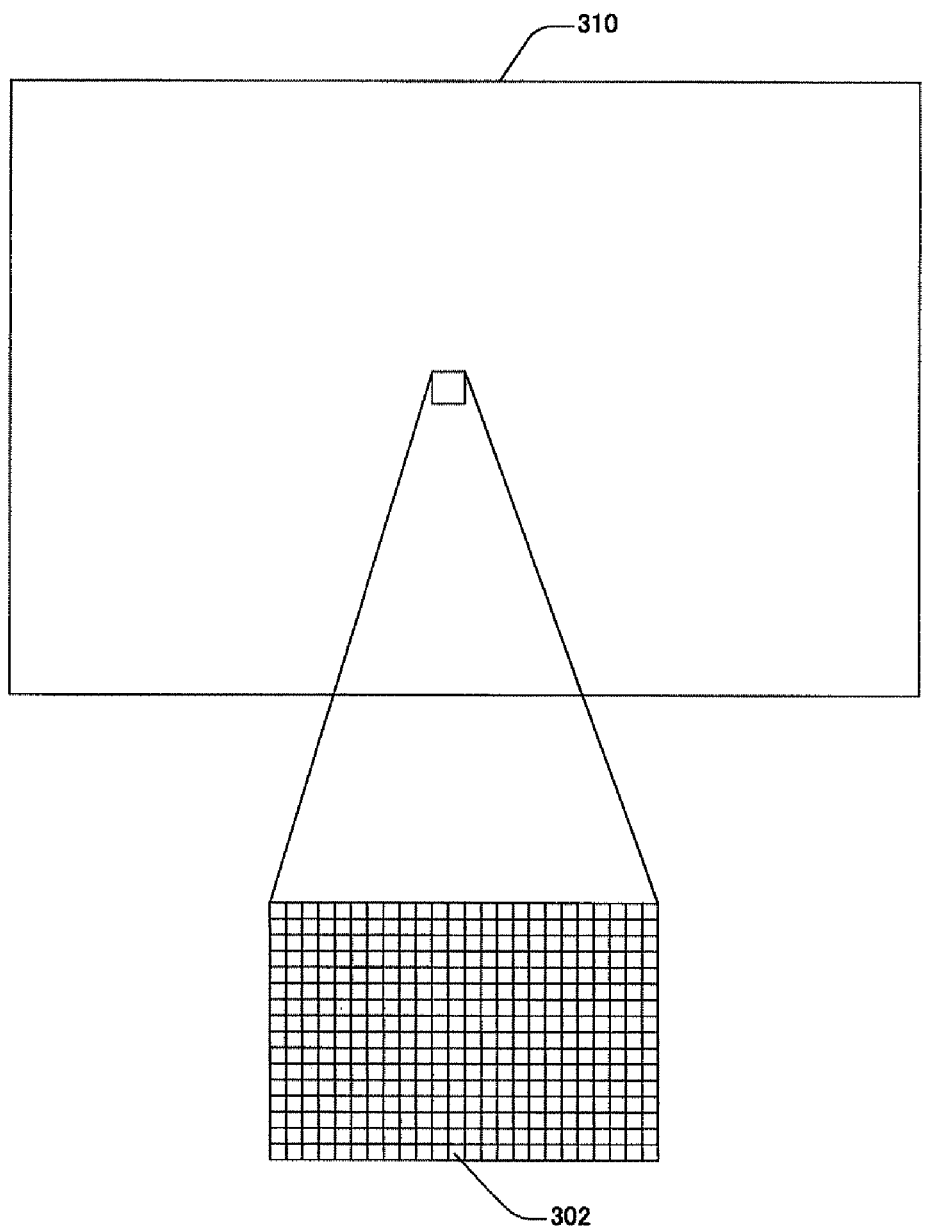
FIG. 12 is a diagram (part 2) for explaining the image display device of FIG. 10.

As illustrated in FIG. 12, the display unit 300 contains a display 310, in which a plurality (the number "n"×the number "m" in this case) of the display elements 302 are arranged in a matrix.

Figure 13:
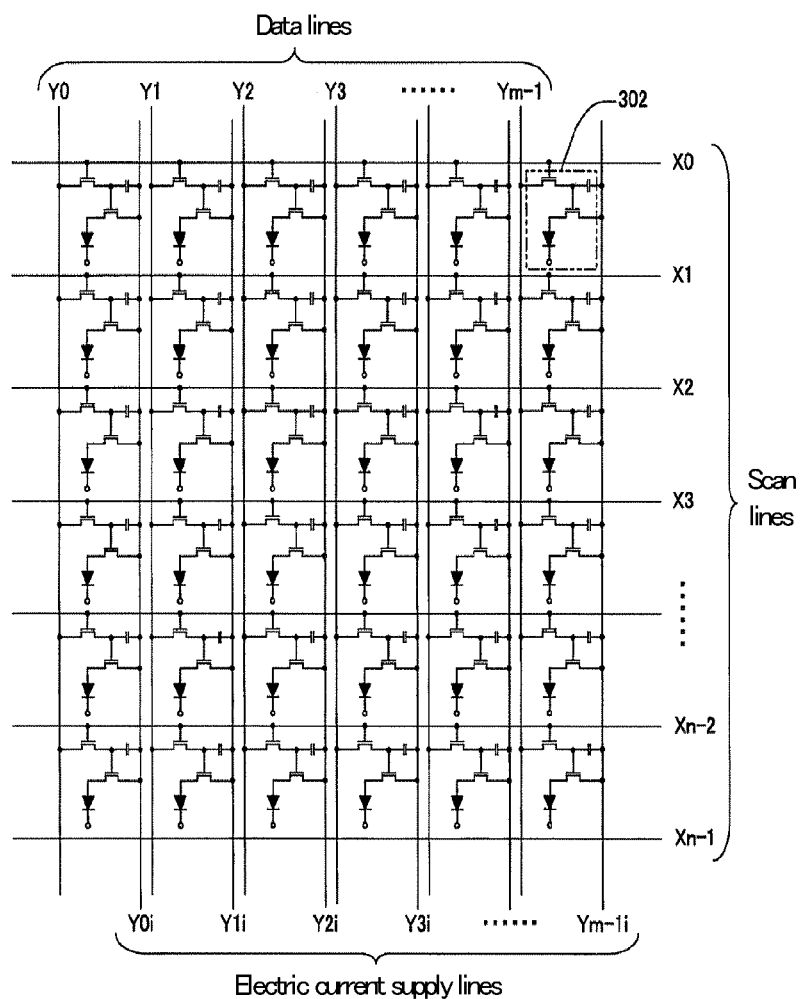
FIG. 13 is a diagram (part 3) for explaining the image display device of FIG. 10.

As illustrated in FIG. 13, moreover, the display 310 contains "n" number of scanning lines (X0, X1, X2, X3, ... Xn−2, Xn−1) arranged along the X axis direction with a constant interval, "m" number of data lines (Y0, Y1, Y2, Y3, ... Ym−1) arranged along the Y axis direction with a constant interval, and "m" number of current supply lines (Y0$i$, Y1$i$, Y2$i$, Y3$i$, ... Ym−1$i$) arranged along the Y axis direction with a constant interval.

As described above, the display element can be specified with the scanning line and the data line.

The display element of the present invention is explained with reference to FIG. 14, hereinafter.

Figure 14:
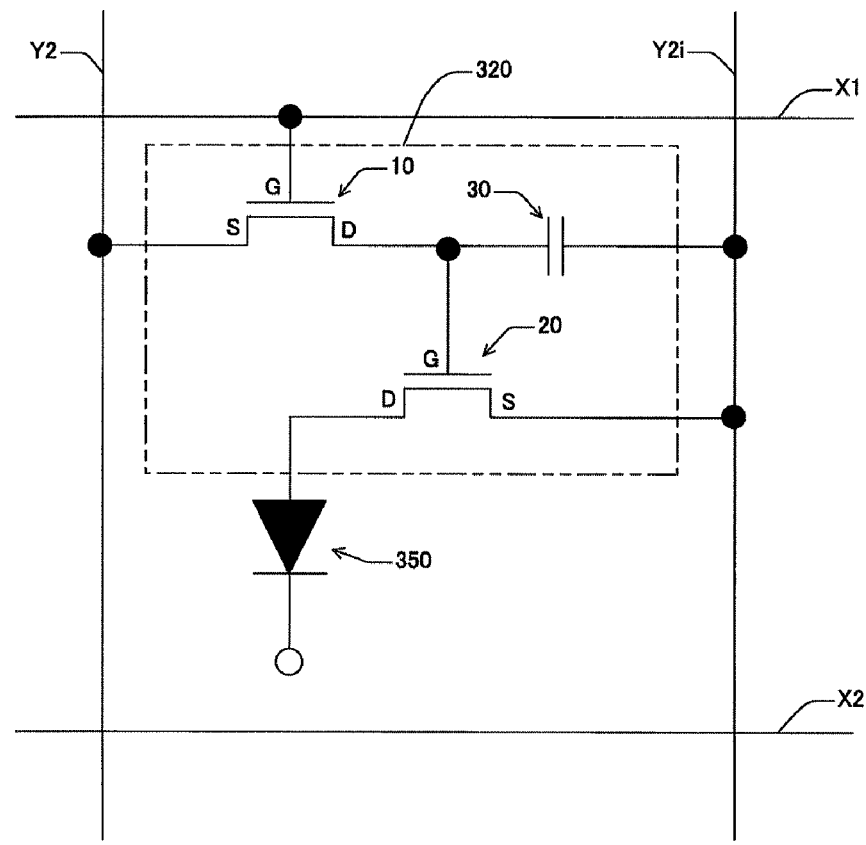
FIG. 14 is a diagram for explaining one example of the display element of the present invention.

FIG. 14 is a schematic diagram illustrating one example of the display element of the present invention.

As illustrated as one example in FIG. 14, the display element contains an organic electroluminescent (EL) element 350, and a driving circuit 320 configured to emit light from the organic EL element 350. Specifically, the display 310 is an organic EL display of a so-called active matrix system. Moreover, the display 310 is a 32-inch color display. Note that, a size of the display is not limited to the aforementioned size.

Figure 15:
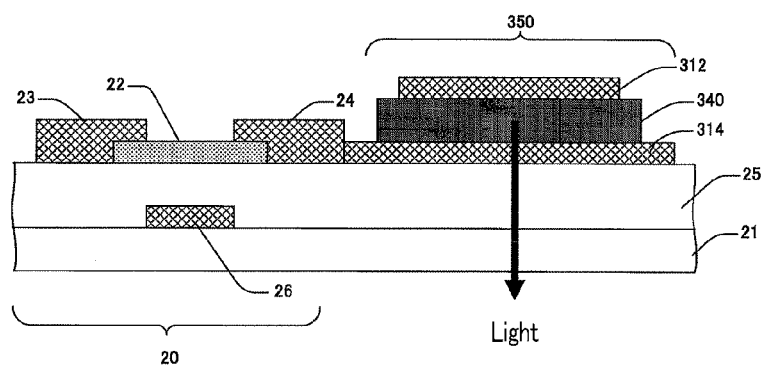
FIG. 15 is a schematic diagram depicting one example of the arrangement of an organic EL element and a field-effect transistor in a display element.

FIG. 15 illustrates one example of a positional relationship between an organic EL element 350 and a field-effect transistor 20 as a driving circuit in a display element 302. In this example, the organic El element 350 is provided next to the field-effect transistor 20. Note that, the field-effect transistor 10 and a capacitor (not illustrated) are formed on the identical substrate.

Although it is not illustrated in FIG. 15, it is preferred that a passivation film is provided above the active layer 22. As for a material of the passivation film, SiO$_2$, SiN$_x$, Al$_2$O$_3$, or a fluoropolymer is suitably used.

Figure 16:
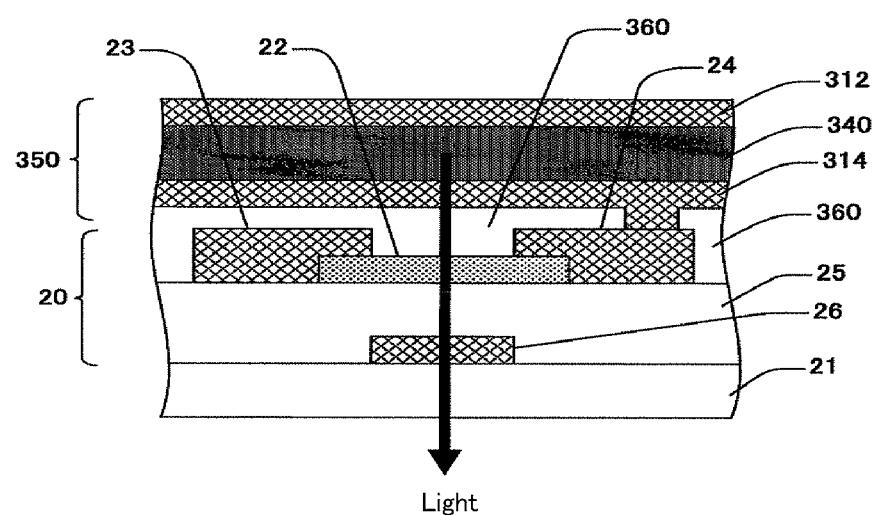
FIG. 16 is a schematic diagram depicting another example of the arrangement of an organic EL element and a field-effect transistor in a display element.

As illustrated in FIG. 16, for example, the organic EL element 350 may be provided on the field-effect transistor 20. In this case, transparency is required for the gate electrode 26. As for the gate electrode 26, therefore, a transparent electroconductive oxide, such as ITO, In$_2$O$_3$, SnO$_2$, ZnO, Ga-doped ZnO, Al-doped ZnO, and Sb-doped SnO$_2$, is used. Note that, the reference number 360 represents an interlayer insulating film (a leveling film). As for the interlayer insulating film, polyimide, or an acrylic resin can be used.

Figure 17:
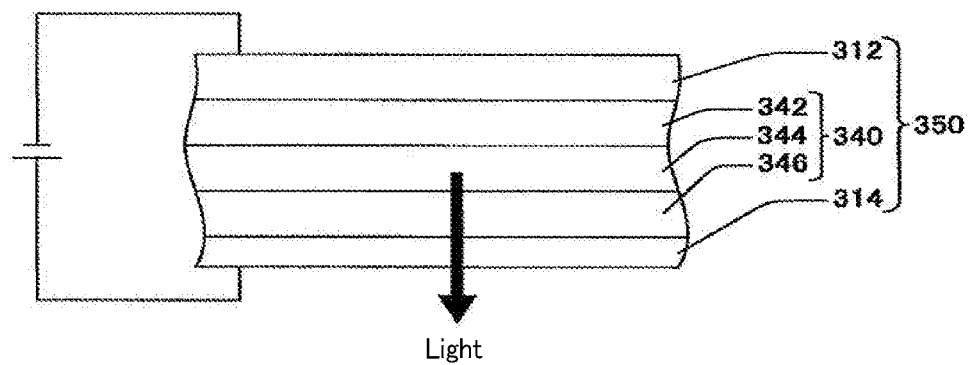
FIG. 17 is a schematic diagram illustrating one example of an organic EL element.

FIG. 17 is a schematic diagram illustrating one example of an organic EL element.

In FIG. 17, the organic EL element 350 contains a cathode 312, an anode 314, and an organic EL thin film layer 340.

A material of the cathode 312 is appropriately selected depending on the intended purpose without any limitation, and examples thereof include aluminum (Al), magnesium (Mg)-silver (Ag) alloy, aluminum (Al)-lithium (Li) alloy, and indium tin oxide (ITO). Note that, the magnesium (Mg)-silver (Ag) alloy forms a high reflectance electrode with a sufficient thickness thereof, and an extremely thin film (less than about 20 nm) thereof forms a semi-transparent electrode. In FIG. 17, light is taken out from the side of the anode, but light can be taken out from the side of the cathode, by making the cathode a transparent or semi-transparent electrode.

A material of the anode 314 is appropriately selected depending on the intended purpose without any limitation, and examples thereof include indium tin oxide (ITO), indium zinc oxide (IZO), and silver (Ag)-neodymium (Nd) alloy. Note that, in the case where the silver alloy is used, a resulting electrode becomes a high reflectance electrode, which is suitable for taking light out from the side of the cathode.

The organic EL thin film layer 340 contains an electron transporting layer 342, a light emitting layer 344, and a hole transporting layer 346. The electron transporting layer 342 is connected to the cathode 312, and the hole transporting layer 346 is connected to the anode 314. The light emitting layer 344 emits light, as the predetermined voltage is applied between the anode 314 and the cathode 312.

Here, the electron transporting layer 342 and the light emitting layer 344 may form one layer. Moreover, an electron injecting layer may be provided between the electron transporting layer 342 and the cathode 312. Further, a hole injecting layer may be provided between the hole transporting layer 346 and the anode 314.

As for the light control element, moreover, the so-called "bottom emission" organic EL element, in which light is taken out from the side of the substrate, is explained above. However, the light control element may be a "top emission" organic EL element, in which light is taken out from the opposite side to the substrate.

The driving circuit 320 in FIG. 14 is explained.

The driving circuit 320 contains two field-effect transistors 10, 20, and a capacitor 30.

The field-effect transistor 10 functions as a switching element. The gate electrode G of the field-effect transistor 10 is connected to the predetermined scanning line, and the source electrode S of the field-effect transistor 10 is connected to the predetermined data line. Moreover, the drain electrode D of the field-effect transistor 10 is connected to one terminal of the capacitor 30.

The field-effect transistor 20 is configured to supply electric current to the organic EL element 350. The gate electrode G of the field-effect transistor 20 is connected to the drain electrode D of the field-effect transistor 10. The drain electrode D of the field-effect transistor 20 is connected to the anode 314 of the organic EL element 350, and the source electrode S of the field-effect transistor 20 is connected to the predetermined current supply line.

The capacitor 30 is configured to store a state of the field-effect transistor 10, i.e., data. The other terminal of the capacitor 30 is connected to the predetermined current supply line.

As the field-effect transistor 10 is turned in the state of "On," the image data is stored in the capacitor 30 via the signal line Y2. Even after turning the field-effect transistor 10 in the state of "Off," the field-effect transistor 20 is maintained in the state of "On" corresponding to the image data so that the organic EL element 350 is driven.

Figure 18:
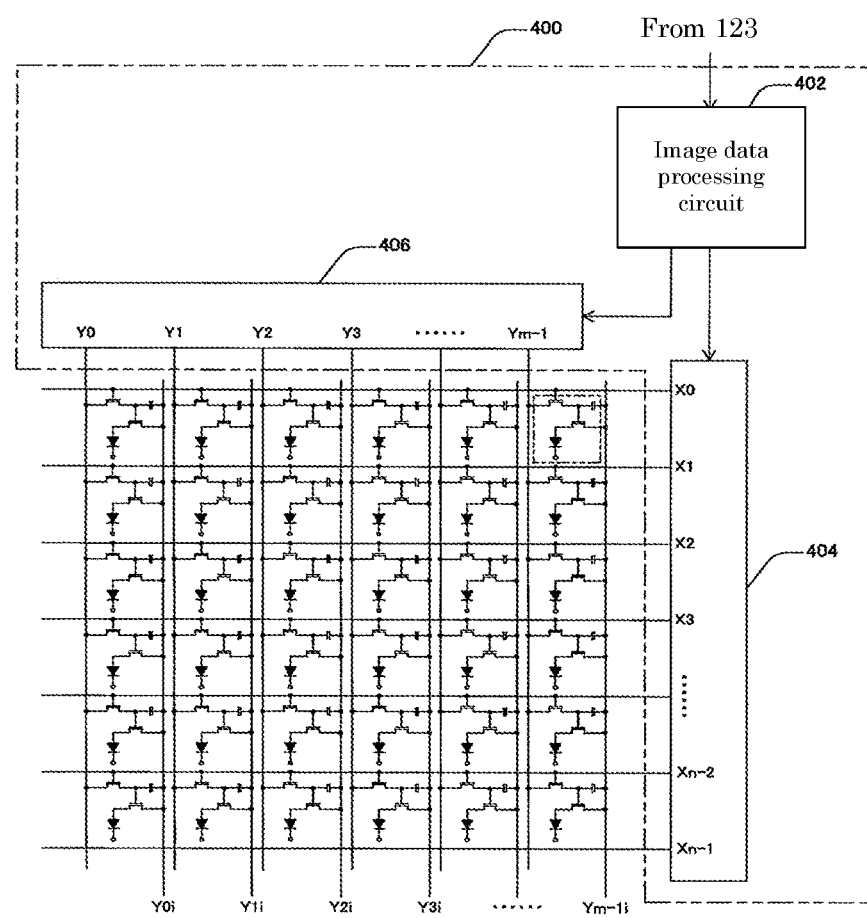
FIG. 18 is a diagram for explaining a display control device.

FIG. 18 is a schematic diagram illustrating another example of the image display device of the present invention.

In FIG. 18, the image display device contains a display element 302, lines (scanning lines, data lines, and current supply lines), and a display control device 400.

The display control device 400 contains an image data processing circuit 402, a scanning line driving circuit 404, and a data line driving circuit 406.

The image data processing circuit 402 judges luminance of a plurality of the display elements 302 in the display based on output signal of the image output circuit 123.

The scanning line driving circuit 404 individually applies voltage to the number "n" of scanning lines according to the instructions of the image data processing circuit 402.

The data line driving circuit 406 individually applies voltage to the number "m" of data lines according to the instruction of the image data processing circuit 402.

The embodiment above explains the case where the light control element is an organic EL element, but the light control element is not limited to the organic EL element. For example, the light control element may be an electrochromic element. In this case, the display is an electrochromic display.

Figure 19:
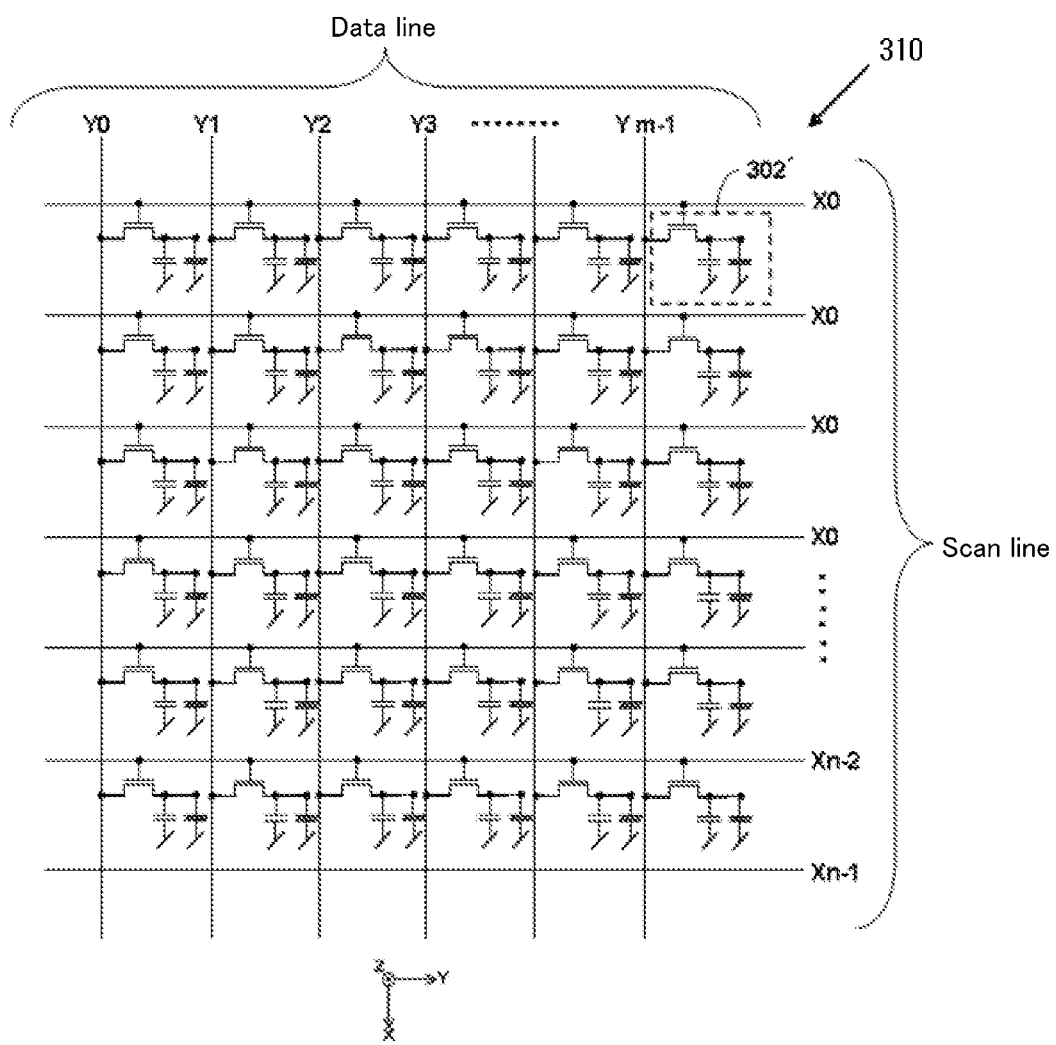
FIG. 19 is a diagram for explaining a liquid crystal display.
Figure 20:
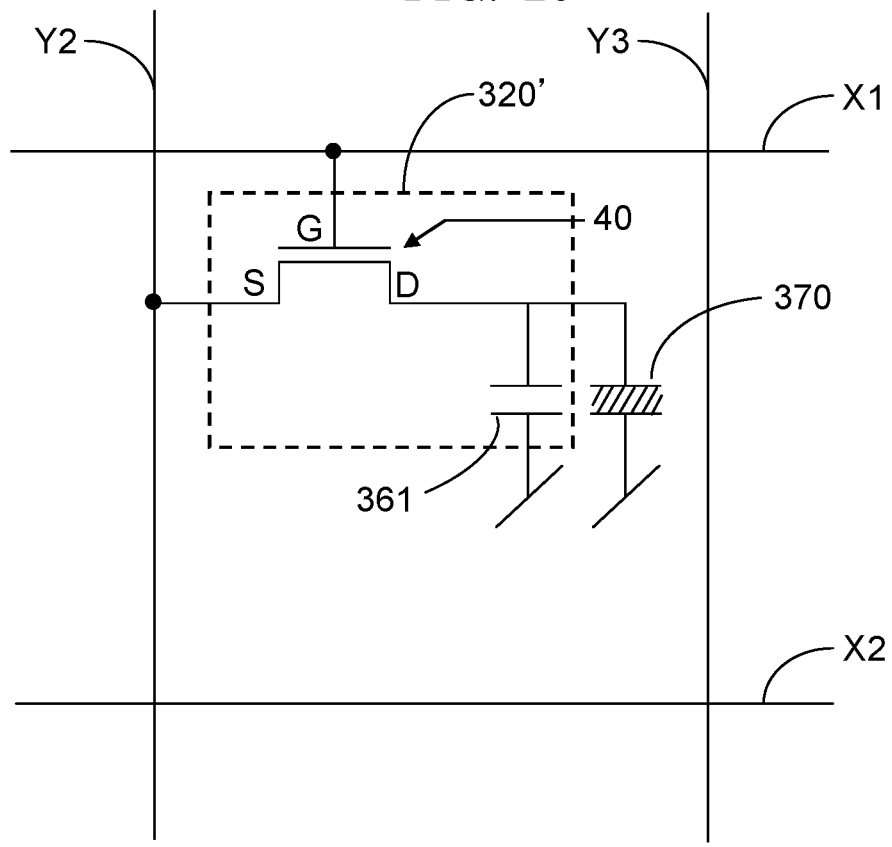
FIG. 20 is a diagram for explaining the display element of FIG. 19.

Moreover, the light control element may be a liquid crystal element. In this case, the display is a liquid crystal display, and a current supply line is not necessary to the display element 302' as illustrated in FIG. 19. As illustrated in FIG. 20, moreover, the driving circuit 320' may be composed of one field-effect transistor 40, which is identical to the field-effect transistors 10 and 20. In the field-effect transistor 40, the gate electrode G is connected to the predetermined scanning line, and the source electrode S is connected to the predetermined data line. Moreover, the drain electrode D is connected to the capacitor 361 and a pixel electrode of the liquid crystal element 370.

Moreover, the light control element may be an electrophoretic element, an inorganic EL element, or an electrowetting element.

The case where the system of the present invention is a television device is explained above, but the system is not limited as long as the system contains the image display device 124 as a device for displaying images and information. For example, the system may be a computer system, in which a computer (including a personal computer) is connected to the image display device 124.

Moreover, the image display device 124 can be used as a display unit in a mobile information device (e.g., a mobile phone, a portable music player, a portable video player, an electronic book, a personal digital assistant (PDA)), or a camera device (e.g., a still camera, a video camera). The image display device 124 can be used as a display unit for various types of information in a transport system (e.g., a car, an air craft, a train, and a ship). Furthermore, the image display device 124 can be used as a display unit for various types of information in a measuring device, an analysis device, a medical equipment, or advertising media.

EXAMPLES

Examples of the present invention are explained hereinafter, but the following examples shall not be construed as to limit the scope of the present invention in any way.

Example 1

Production of Field-Effect Transistor

—Formation of Gate Electrode—
On a glass substrate, Al was deposited to have a thickness of 100 nm by vapor deposition, and then the deposited Al was patterned into the form of a line through photolithography and etching, to thereby form a gate electrode.
—Formation of Gate Insulating Layer—
A film of $SiO_2$ was formed by plasma CVD to have a thickness of 200 nm, to thereby form a gate insulating layer.
—Formation of Active Layer—
On the formed insulating layer, a Mg—In based oxide semiconductor film (active layer) was formed by sputtering in the method described in Examples of JP-A No. 2010-74148. As for a target, a polycrystalline sintered compact having a composition of $In_2MgO_4$ was used. The back pressure in the sputtering chamber was set to $2 \times 10^{-5}$ Pa. The total pressure was set to 0.3 Pa by adjusting flow rates of argon gas and oxygen gas supplied during the sputtering. An amount of oxygen in the oxide semiconductor film and the electron carrier density were controlled by adjusting the flow rate of the oxygen gas. The oxygen flow rate during the sputtering is depicted in Table 1.

A thickness of the obtained oxide semiconductor film (active layer) was 50 nm.
—Formation of Source Electrode and Drain Electrode—
On the formed active layer, a gold nanometal ink (Au-1Chb, manufactured by ULVAC, Inc., the average particle diameter: 5 nm, the metal content: 50% by mass) was applied into the predetermined pattern by means of an inkjet device. The applied ink was heated in the air for 30 minutes at 300° C., to form a source electrode and a drain electrode each having a thickness of 100 nm. A channel width was 400 μm, and a channel length specified with a length between the source electrode and the drain electrode was 50 μm.

In the manner as described above, a bottom gate/top contact field-effect transistor was produced.
—Production of Element Used for Work Function Measurement—
In order to measure work function, an element used for work function measurement was obtained by forming a metal film on a glass substrate in the same manner as in the formation of the source electrode and drain electrode.
<Production of Element for Hall Effect Measurement>
—Formation of n-Type Oxide Semiconductor Film—
In the same manner as in the aforementioned formation of the active layer of the field-effect transistor, a square pattern of a n-type oxide semiconductor having a side of 8 mm was formed on a glass substrate through a shadow mask. The conditions for the sputtering were set the same as in the formation of the active layer. The conditions for sputtering are depicted in Table 1.
—Formation of Contact Electrode—
A contact electrode for hall effect measurement was formed on the glass substrate, on which the n-type oxide semiconductor film had been formed, by vacuum deposition using a shadow mask. As for a deposition source, Al was used.
<Evaluation of Electron Carrier Density (Concentration)>
The element for hall effect measurement was subjected to the measurements of specific resistance and hall effect by means of a hall effect measurement system (ResiTest8300, manufactured by TOYO Corporation), to thereby determined an electron carrier density of $(cm^{-3})$ the n-type oxide semiconductor. The obtained electron carrier density (concentration) is depicted in Table 1.
<Evaluation of Work Function>
The work function of the metal film of the element for work function measurement was determined by means of a photoelectron spectrometer in air AC-2 (manufactured by RIKEN KEIKI Co., Ltd.). The obtained work function is depicted in Table 1.
<Evaluation of Transistor Performance>
An evaluation of transistor performance was performed on the obtained field-effect transistor by means of a semiconductor parameter analyzer (Semiconductor Parameter Analyzer 4156C, manufactured by Agilent Technologies, Inc.). Current-voltage characteristics were evaluated by setting the source-drain voltage Vds to 20 V, and varying the gate voltage Vg from −30 V to +30 V. The field-effect mobility was calculated in the saturated region. Moreover, a ratio (on/off ratio) of the source-drain current Ids of the transistor in the "on" state (e.g., Vg=20 V) to that in the "off" state (e.g., Vg=−20 V) was calculated. Moreover, the gate voltage (turn-on voltage), with which the source-drain current Ids turned to increase was calculated. The results are depicted in Table 1.

Note that, FIG. 7 is a diagram depicting current-voltage characteristics of Example 1 with the carrier density of $1.0 \times 10^{18}$ $cm^{-3}$. Moreover, FIG. 6 is a diagram depicting current-voltage characteristics of Comparative Example 1 with the carrier density of $5.9 \times 10^{15}$ $cm^{-3}$.

Example 2

A bottom gate/top contact field-effect transistor was produced in the same manner as in Example 1, provided that the formation of the source electrode and drain electrode was changed to the following method. Moreover, the evaluations were carried out in the same manner as in Example 1. The results are depicted in Table 2.

—Formation of Source Electrode and Drain Electrode—

On the formed active layer, a silver nanometal ink (NPS-J, manufactured by Harima Chemical Group, Inc., the average particle diameter: 5 nm, the metal content: 59% by mass) was applied into the predetermined pattern by means of an inkjet device. The applied ink was heated in the air for 30 minutes at 220° C., to thereby form a source electrode and a drain electrode each having a thickness of 100 nm. A channel width was 400 µm, and a channel length specified with a length between the source electrode and the drain electrode was 50 µm.

Example 3

A bottom gate/top contact field-effect transistor was produced in the same manner as in Example 1, provided that the formation of the source electrode and drain electrode was changed to the following method. Moreover, the evaluations were carried out in the same manner as in Example 1. The results are depicted in Table 3.

—Formation of Source Electrode and Drain Electrode—

On the formed active layer, a silver-palladium nanoparticle paste (NAGNPD15-K04, manufactured by DAIKEN CHEMICAL CO., LTD., the average particle diameter: 4 nm to 10 nm, the metal content: 21% by mass) was applied into the predetermined pattern by means of an inkjet device. The applied ink was heated in the art for 30 minutes at 300° C., to thereby form a source electrode and a drain electrode each having a thickness of 100 nm. A channel width was 400 µm, and a channel length specified with a length between the source electrode and the drain electrode was 50 µm.

Example 4

A bottom gate/bottom contact field-effect transistor was produced in the same manner as in Example 1, provided that the formation of the source electrode and drain electrode and the formation of the active layer were changed to the following methods. Moreover, the evaluations were carried out in the same manner as in Example 1. The results are depicted in Table 4.

—Formation of Source Electrode and Drain Electrode—

On the formed gate insulating layer, a source electrode and a drain electrode was formed using Pt by photolithography and a lift-off process. The Pt film was formed by sputtering. As for the sputtering, the sputtering powder was 200 W, the pressure at the time of forming the film was 0.35 Pa, and the thickness of the film was 50 nm. A channel length specified with a length between the source electrode and the drain electrode was 50 µm.

—Formation of Active Layer—

On the formed source electrode and drain electrode as well as the gate insulating layer, a Mg—In based oxide semiconductor film (active layer) was formed by sputtering in the method described in JP-A No. 2010-74148. As for a target, a polycrystalline sintered compact having a composition of $In_2MgO_4$. The back pressure in the sputtering chamber was set to $2 \times 10^{-5}$ Pa. The total pressure was set to 0.3 Pa by adjusting flow rates of argon gas and oxygen gas supplied during the sputtering. An amount of oxygen in the oxide semiconductor film and the electron carrier density were controlled by adjusting the flow rate of the oxygen gas. The oxygen flow rate during the sputtering is depicted in Table 4.

A thickness of the obtained oxide semiconductor film (active layer) was 50 nm.

Example 5

A bottom gate/top contact field-effect transistor was produced in the same manner as in Example 1, provided that the formation of the source electrode and drain electrode was changed to the following method. Moreover, the evaluations were carried out in the same manner as in Example 1. The results are depicted in Table 5.

—Formation of Source Electrode and Drain Electrode—

On the formed active layer, an Au resinate solution (an organometallic compound, manufactured by DAIKEN CHEMICAL CO., LTD., metal content: 20% by mass) was applied into the predetermined pattern by means of an inkjet device. The applied ink was heated in the art for 60 minutes at 300° C., to thereby form a source electrode a drain electrode each having a thickness of 100 nm. A channel width was 400 µm, and a channel length specified with a length between the source electrode and the drain electrode was 50 µm.

Example 6

A bottom gate/top contact field-effect transistor was produced in the same manner as in Example 1, provided that the formation of the source electrode and drain electrode was changed to the following method. Moreover, the evaluations were carried out in the same manner as in Example 1. The results are depicted in Table 6.

—Formation of Source Electrode and Drain Electrode—

On the formed active layer, a Pt resinate solution (an organic platinum compound, manufactured by DAIKEN CHEMICAL CO., LTD., metal content: 10% by mass) was applied into the predetermined pattern by means of an inkjet device. The applied ink was heated in the air for 60 minutes at 300° C., to thereby form a source electrode and a drain electrode each having a thickness of 100 nm. A channel width was 400 µm, and a channel length specified with a length between the source electrode and the drain electrode was 50 µm.

Comparative Example 1

A bottom gate/bottom contact field-effect transistor was produced in the same manner as in Example 1, provided that the formation of the source electrode and drain electrode and the formation of the active layer were changed to the following methods. Moreover, the evaluations were carried out in the same manner as in Example 1. The results are depicted in Table 7.

—Formation of Source Electrode and Drain Electrode—

On the formed gate insulating layer, a source electrode and a drain electrode each having a thickness of 100 nm were formed by vacuum deposition. As for deposition source, gold was used. A channel width was 400 µm, and a channel length was 50 µm.

—Formation of Active Layer—

On the formed source electrode and drain electrode as well as the gate insulating layer, a Mg—In based oxide semiconductor film (active layer) was formed by sputtering in the method described in JP-A No. 2010-74148. As for a target, a polycrystalline sintered compact having a composition of $In_2MgO_4$ was used. The back pressure in the sputtering chamber was set to $2 \times 10^{-5}$ Pa. The total pressure was set to 0.3 Pa by adjusting flow rates of argon gas and oxygen gas supplied during the sputtering. An amount of oxygen in the oxide semiconductor film and the electron carrier density were controlled by adjusting the flow rate of the oxygen gas. The oxygen flow rate during the sputtering is depicted in Table 7.

A thickness of the obtained oxide semiconductor film (active layer) was 50 nm.

TABLE 1

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 1 | 10 | 4.7E+17 | Au | Coating | 4.91 | 5.4 | 2.3 | 2.0 |
|  | 2.00 | 1.0E+18 |  |  |  | 5.6 | 4.7 | 1.0 |
|  | 1.00 | 1.2E+18 |  |  |  | 5.9 | 3.6 | 1.0 |
|  | 0.90 | 4.0E+18 |  |  |  | 6 | 5.7 | 0.5 |
|  | 0.80 | 5.1E+18 |  |  |  | 6.3 | 5.1 | 0.5 |
|  | 0.70 | 7.5E+18 |  |  |  | 8.4 | 2.8 | 0.5 |
|  | 0.60 | 9.5E+18 |  |  |  | 8.6 | 1.9 | 0.0 |
|  | 0.50 | 1.1E+19 |  |  |  | 8.8 | 1.3 | 0.0 |
|  | 0.35 | 2.1E+19 |  |  |  | 8.9 | 1.2 | 0.0 |
|  | 0.20 | 4.0E+19 |  |  |  | 9 | 1.1 | 0.0 |

Note that, "E" in Tables 1 to 16, 18 and 19 denotes "the exponent of 10." For example, "1.0E+17" is "1.0×10$^{17}$," and "1.0E-05" is "0.00001." E denotes the same in FIGS. 6 to 9, and 21 to 24.

TABLE 2

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 2 | 10 | 4.7E+17 | Ag | Coating | 5.10 | 4.2 | 5.2 | 3.0 |
|  | 2.00 | 1.0E+18 |  |  |  | 4.3 | 2.8 | 3.0 |
|  | 1.00 | 1.2E+18 |  |  |  | 4.5 | 3.7 | 2.0 |
|  | 0.90 | 4.0E+18 |  |  |  | 5.1 | 2.6 | 2.0 |
|  | 0.80 | 5.1E+18 |  |  |  | 5.6 | 4.8 | 2.0 |
|  | 0.70 | 7.5E+18 |  |  |  | 8.6 | 3.1 | 2.0 |
|  | 0.60 | 9.5E+18 |  |  |  | 9.2 | 4.1 | 1.0 |
|  | 0.50 | 1.1E+19 |  |  |  | 10.1 | 3.4 | 1.0 |
|  | 0.35 | 2.1E+19 |  |  |  | 10.7 | 2.8 | 1.0 |
|  | 0.20 | 4.0E+19 |  |  |  | 10.7 | 2.8 | 0.0 |

TABLE 3

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 3 | 10 | 4.7E+17 | Ag/Pd | Coating | 5.20 | 2.5 | 6.6 | 3.0 |
|  | 2.00 | 1.0E+18 |  |  |  | 3.2 | 4.3 | 3.0 |
|  | 1.00 | 1.2E+18 |  |  |  | 3.5 | 5.6 | 3.0 |
|  | 0.90 | 4.0E+18 |  |  |  | 3.9 | 4.7 | 2.0 |
|  | 0.80 | 5.1E+18 |  |  |  | 6.1 | 3.8 | 2.0 |
|  | 0.70 | 7.5E+18 |  |  |  | 7.5 | 1.4 | 2.0 |
|  | 0.60 | 9.5E+18 |  |  |  | 9.4 | 3.3 | 2.0 |
|  | 0.50 | 1.1E+19 |  |  |  | 10.6 | 1.8 | 1.0 |
|  | 0.35 | 2.1E+19 |  |  |  | 10.9 | 1.2 | 1.0 |
|  | 0.20 | 4.0E+19 |  |  |  | 10.9 | 1.2 | 0.0 |

TABLE 4

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 4 | 10 | 4.7E+17 | Pt | Vacuum deposition | 5.30 | 2.4 | 8.9 | 3.0 |
| | 2.00 | 1.0E+18 | | | | 3.2 | 8.7 | 3.0 |
| | 1.00 | 1.2E+18 | | | | 3.4 | 7.4 | 2.5 |
| | 0.90 | 4.0E+18 | | | | 3.8 | 7.1 | 2.5 |
| | 0.80 | 5.1E+18 | | | | 6.3 | 6.4 | 2.5 |
| | 0.70 | 7.5E+18 | | | | 7.6 | 5.7 | 2.5 |
| | 0.60 | 9.5E+18 | | | | 9.4 | 6.1 | 2.0 |
| | 0.50 | 1.1E+19 | | | | 10.5 | 5.5 | 2.0 |
| | 0.35 | 2.1E+19 | | | | 11.1 | 3.9 | 1.0 |
| | 0.20 | 4.0E+19 | | | | 11.1 | 3.9 | 1.0 |

TABLE 5

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 5 | 10 | 4.7E+17 | Au | Coating | 4.95 | 4.3 | 4.1 | 2.0 |
| | 2.00 | 1.0E+18 | | | | 4.3 | 3.2 | 1.0 |
| | 1.00 | 1.2E+18 | | | | 4.6 | 2.6 | 1.0 |
| | 0.90 | 4.0E+18 | | | | 4.8 | 2.4 | 1.0 |
| | 0.80 | 5.1E+18 | | | | 5.2 | 1.5 | 1.0 |
| | 0.70 | 7.5E+18 | | | | 6.3 | 6.2 | 0.5 |
| | 0.60 | 9.5E+18 | | | | 7.7 | 1.1 | 0.5 |
| | 0.50 | 1.1E+19 | | | | 7.9 | 1.2 | 0.0 |
| | 0.35 | 2.1E+19 | | | | 8.2 | 1.1 | 0.0 |
| | 0.20 | 4.0E+19 | | | | 10.3 | 1.1 | 0.0 |

TABLE 6

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 6 | 10 | 4.7E+17 | Pt | Coating | 5.40 | 3.6 | 3.6 | 3.0 |
| | 2.00 | 1.0E+18 | | | | 4.1 | 2.9 | 3.0 |
| | 1.00 | 1.2E+18 | | | | 4.1 | 4.8 | 2.5 |
| | 0.90 | 4.0E+18 | | | | 4.6 | 4.7 | 2.5 |
| | 0.80 | 5.1E+18 | | | | 5.8 | 3.5 | 2.0 |
| | 0.70 | 7.5E+18 | | | | 6.4 | 6.1 | 2.0 |
| | 0.60 | 9.5E+18 | | | | 7.8 | 7.4 | 2.0 |
| | 0.50 | 1.1E+19 | | | | 9.3 | 1.8 | 1.5 |
| | 0.35 | 2.1E+19 | | | | 9.8 | 2.4 | 0.5 |
| | 0.20 | 4.0E+19 | | | | 10.4 | 2.7 | 0.0 |

TABLE 7

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Comp. Ex. 1 | 50 | 5.9E+15 | Au | Vacuum deposition | 4.74 | — | — | — |
| | 10 | 4.7E+17 | | | | 1.8 | 0.3 | −0.5 |

TABLE 7-continued

| Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|
| 2.00 | 1.0E+18 | | | | 1.9 | 1.2 | −1.0 |
| 1.00 | 1.2E+18 | | | | 2.1 | 1.4 | −2.0 |
| 0.90 | 4.0E+18 | | | | 2.5 | 2.3 | −4.0 |
| 0.80 | 5.1E+18 | | | | 5.3 | 1.2 | −5.0 |
| 0.70 | 7.5E+18 | | | | 6.1 | 0.2 | −8.0 |
| 0.60 | 9.5E+18 | | | | 7.5 | 0.025 | −15 |
| 0.50 | 1.1E+19 | | | | — | 0.0001 | — |
| 0.35 | 2.1E+19 | | | | — | 0.00001 | — |
| 0.20 | 4.0E+19 | | | | — | 0.000001 | — |

As for TFT used as a switching element, the field-effect mobility (carrier mobility) thereof is preferably 1.0 cm$^2$/Vs or greater, more preferably 2.0 cm$^2$/Vs or greater. Moreover, the on/off ratio is preferably 1×10$^6$ or greater, more preferably 1×10$^7$ or greater, and particularly preferably 1.0×10$^8$ or greater. The absolute value of the turn-on voltage is preferably 5 V or lower, more preferably 3 V or lower. Moreover, the normally-off properties with which the turn-on voltage is 0 V or greater is particularly preferable.

Tables 1 to 7 depict the film forming conditions of the oxide semiconductor films formed in Examples 1 to 6 and Comparative Example 1, the carrier density of the oxide semiconductor films, types of source and drain electrodes, the forming methods of the source and drain electrode, the work functions of the metal films formed in the same manner as the source and drain electrodes, and the transistor characteristics of the field-effect transistors.

Examples 1 to 6 show the results when Au, Ag, Ag/Pd, or Pt formed by coating, or Pt formed by vacuum deposition is used as source and drain electrodes. It could be understood from the results of the transistor characteristics depicted in Tables 1 to 6 that a high field-effect mobility, a high on/off ratio, and a small absolute value of the turn-on voltage were attained with the electron carrier density in the range of 4.0×10$^{17}$ cm$^{-3}$ to 4.0×10$^{19}$ cm$^{-3}$. Since the electron carrier density of the oxide semiconductor was high, contact resistance between the metal and the oxide semiconductor was not large at the contact interface, and therefore the desirable device properties were exhibited.

The transistor using Au formed by coating had a high on/off ratio, and normally-off transistor properties where a small absolute value of the turn-on voltage even with the oxide semiconductor having the electron carrier density of 4.0×10$^{17}$ cm$^{-3}$ or greater. This is because the work function of Au formed by coating is higher than the work function of Au formed by vacuum deposition.

On the other hand, the results of Comparative Example 1 with the electron carrier density (concentration) of 5.9×10$^{15}$ cm$^{-3}$ shows the results of a transistor using a n-type oxide semiconductor having the electron carrier density (concentration) of 1×10$^{15}$ cm$^{-3}$ to 1×10$^{16}$ cm$^{-3}$, which is typically suitably used for a transistor using a n-type oxide semiconductor, and gold formed by vacuum deposition is used as source and drain electrodes. In this case, the on-current is low, i.e. about 1×10$^9$ A, and the transistor hardly functions. This is because Schottky barrier junction is formed at a plane where the gold having a relatively high work function and the n-type oxide semiconductor are in contact, and thus contact resistance becomes large.

Other than above, Comparative Example 1 shows the results of the transistor using the n-type oxide semiconductor with electron carrier density of 4.0×10$^{17}$ cm$^{-3}$ or greater, and gold formed by vacuum deposition is used as source and drain electrode. In the case where the electron carrier density is in the range of 4.0×10$^{17}$ cm$^{-3}$ or greater but less than 1.2×10$^{18}$ cm$^{-3}$, transistor properties that the field-effect mobility is high, an on/off ratio is high, and an absolute value of the turn-on voltage is small are obtained. However, the turn-on voltage is negative, that means it is not normally-off operation. When the electron carrier density is equal to or greater than the aforementioned range (4.0×10$^{18}$ cm$^{-3}$ or greater), the absolute value of the turn-on voltage tends to be large. When the electron carrier density is 1.1×10$^{19}$ cm$^{-3}$ or greater, the transistor operation cannot be attained.

Example 7

A bottom gate/top contact field-effect transistor was produced in the same manner as in Example 1, provided that the formation of the active layer was changed to the following method. Moreover, the evaluations were carried out in the same manner as in Example 1. The results are depicted in Table 8.

—Formation of Active Layer—

On the formed insulating layer, an In—Ga—Zn based oxide thin film was formed by DC sputtering.

As for a target, a polycrystalline sintered compact of In—Ga—Zn—O to give a composition ratio of In:Ga:Zn=1:1:1 was used. The sputtering power was set to 140 W, the pressure during the formation of the film was set to 0.69 Pa, and the temperature of the substrate was not controlled. The total pressure was set to 0.69 Pa by adjusting flow rates of argon gas and oxygen gas supplied during the sputtering. The duration for forming the film was 20 minutes, and the thickness of the film was 70 nm. An amount of oxygen in the oxide semiconductor film could be controlled by adjusting the oxygen flow rate, to thereby control the electron carrier density. The oxygen flow rate during the sputtering is depicted in Table 8.

Example 8

A bottom gate/top contact field-effect transistor was produced in the same manner as in Example 7, provided that the formation of the source electrode and drain electrode was changed to the following method. Moreover, the evaluations were carried out in the same manner as in Example 1. The results are depicted in Table 9.

—Formation of Source Electrode and Drain Electrode—

On the formed active layer, a silver nanometal ink (NPS-J, manufactured by Harima Chemical Group, Inc., the average particle diameter: 5 nm, the metal content: 59% by mass) was applied into the predetermined pattern by means of an inkjet device. The applied ink was heated in the air for 30 minutes at 220° C., to thereby form a source electrode and a drain electrode each having a thickness of 100 nm. A channel width was 400 µm, and a channel length specified with a length between the source electrode and the drain electrode was 50 µm.

Example 9

A bottom gate/top contact field-effect transistor was produced in the same manner as in Example 7, provided that the formation of the source electrode and drain electrode was changed to the following method. Moreover, the evaluations were carried out in the same manner as in Example 1. The results are depicted in Table 10.
—Formation of Source Electrode and Drain Electrode—

On the formed active layer, a silver-palladium nanoparticle paste (NAGNPD15-K04, manufactured by DAIKEN CHEMICAL CO., LTD., the average particle diameter: 4 nm to 10 nm, the metal content: 21% by mass) was applied into the predetermined pattern by means of an inkjet device. The applied ink was heated in the air for 30 minutes at 300° C., to thereby form a source electrode and a drain electrode each having a thickness of 100 nm. A channel width was 400 µm, and a channel length specified with a length between the source electrode and the drain electrode was 50 µm.

Example 10

A bottom gate/bottom contact field-effect transistor was produced in the same manner as in Example 7, provided that the formation of the source electrode and drain electrode and the formation of the active layer were changed to the following methods. Moreover, the evaluations were carried out in the same manner as in Example 1. The results are depicted in Table 11.
—Formation of Source Electrode and Drain Electrode—

On the formed gate insulating layer, a source electrode and a drain electrode was formed using Pt by photolithography and a lift-off process. The Pt film was formed by sputtering. As for the sputtering, the sputtering powder was 200 W, the pressure at the time of forming the film was 0.35 Pa, and the thickness of the film was 50 nm. A channel length specified with a length between the source electrode and the drain electrode was 50 µm.
—Formation of Active Layer—

On the formed source electrode and drain electrode as well as the gate insulating layer, an In—Ga—Zn based oxide thin film was formed by DC sputtering.

As for a target, a sintered compact of to give a composition ratio of In:Ga:Zn=1:1:1 was used. The sputtering power was set to 140 W, the pressure during the formation of the film was set to 0.69 Pa, and the temperature of the substrate was not controlled. The total pressure was set to 0.69 Pa by adjusting flow rates of argon gas and oxygen gas fed during the sputtering. The duration for forming the film was 20 minutes, and the thickness of the film was 70 nm. An amount of oxygen in the oxide semiconductor film could be controlled by adjusting the oxygen flow rate, to thereby control the electron carrier density. The oxygen flow rate during the sputtering is depicted in Table 11.

Example 11

A bottom gate/top contact field-effect transistor was produced in the same manner as in Example 7, provided that the formation of the source electrode and drain electrode was changed to the following method. Moreover, the evaluations were carried out in the same manner as in Example 1. The results are depicted in Table 12.
—Formation of Source Electrode and Drain Electrode—

On the formed active layer, an Au resinate solution (an organometallic compound, manufactured by DAIKEN CHEMICAL CO., LTD., metal content: 20% by mass) was applied into the predetermined pattern by means of an inkjet device. The applied ink was heated in the air for 60 minutes at 300° C., to thereby form a source electrode and a drain electrode each having a thickness of 100 nm. A channel width was 400 µm, and a channel length specified with a length between the source electrode and the drain electrode was 50 µm.

Example 12

A bottom gate/top contact field-effect transistor was produced in the same manner as in Example 7, provided that the formation of the source electrode and drain electrode was changed to the following method. Moreover, the evaluations were carried out in the same manner as in Example 1. The results are depicted in Table 13.
—Formation of Source Electrode and Drain Electrode—

On the formed active layer, a Pt resinate solution (an organic platinum compound, manufactured by DAIKEN CHEMICAL CO., LTD., metal content: 10% by mass) was applied into the predetermined pattern by means of an inkjet device. The applied ink was heated in the air for 60 minutes at 300° C., to thereby form a source electrode and a drain electrode each having a thickness of 100 nm. A channel width was 400 µm, and a channel length specified with a length between the source electrode and the drain electrode was 50 µm.

Comparative Example 2

A field-effect transistor was produced in the same manner as in Example 7, provided that the formation of the source electrode and drain electrode and the formation of the active layer were changed to the following methods. Moreover, the evaluations were carried out in the same manner as in Example 1. The results are depicted in Table 14.
—Formation of Source Electrode and Drain Electrode—

On the formed gate insulating layer, a source electrode and a drain electrode each having a thickness of 100 nm were formed by vacuum deposition. As for deposition source, gold was used. A channel width was 400 µm, and a channel length was 50 µm.
—Formation of Active Layer—

On the formed source electrode and drain electrode as well as the gate insulating layer, an In—Ga—Zn based oxide thin film was formed by DC sputtering.

As for a target, a sintered compact of In—Ga—Zn—O to give a composition ratio of In:Ga:Zn=1:1:1 was used. The sputtering power was set to 140 W, the pressure during the formation of the film was set to 0.69 Pa, and the temperature of the substrate was not controlled. The total pressure was set to 0.69 Pa by adjusting flow rates of argon gas and oxygen gas fed during the sputtering. The duration for forming the film was 20 minutes, and the thickness of the film was 70 nm. An amount of oxygen in the oxide semiconductor film could be controlled by adjusting the oxygen flow rate, to thereby control the electron carrier density. The oxygen flow rate during the sputtering is depicted in Table 14.

TABLE 8

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 7 | 1.7 | 7.5E+17 | Au | Coating | 4.91 | 7.7 | 3.9 | 1.0 |
| | 1.5 | 1.2E+18 | | | | 7.7 | 7.2 | 1.0 |
| | 1.4 | 2.0E+18 | | | | 7.8 | 5.6 | 0.5 |
| | 1.3 | 5.2E+18 | | | | 8.2 | 4.5 | 0.5 |
| | 1.1 | 9.3E+18 | | | | 8.5 | 4.3 | 0.5 |
| | 1.0 | 1.5E+19 | | | | 9.0 | 1.8 | 0.0 |
| | 0.9 | 4.1E+19 | | | | 11.2 | 3.6 | 0.0 |

TABLE 9

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 8 | 1.7 | 7.5E+17 | Ag | Coating | 5.10 | 7.6 | 2.8 | 1.0 |
| | 1.5 | 1.2E+18 | | | | 7.7 | 4.5 | 1.0 |
| | 1.4 | 2.0E+18 | | | | 8.1 | 4.1 | 1.0 |
| | 1.3 | 5.2E+18 | | | | 8.1 | 1.8 | 0.0 |
| | 1.1 | 9.3E+18 | | | | 8.7 | 2.9 | 0.0 |
| | 1.0 | 1.5E+19 | | | | 9.2 | 3.8 | 0.0 |
| | 0.9 | 4.1E+19 | | | | 10.3 | 2.4 | 0.0 |

TABLE 10

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 9 | 1.7 | 7.5E+17 | Ag/Pd | Coating | 5.20 | 7.1 | 2.3 | 3.0 |
| | 1.5 | 1.2E+18 | | | | 7.2 | 3.7 | 3.0 |
| | 1.4 | 2.0E+18 | | | | 7.4 | 2.4 | 2.0 |
| | 1.3 | 5.2E+18 | | | | 7.6 | 1.9 | 2.0 |
| | 1.1 | 9.3E+18 | | | | 7.9 | 2.5 | 1.0 |
| | 1.0 | 1.5E+19 | | | | 9.1 | 3.8 | 1.0 |
| | 0.9 | 4.1E+19 | | | | 9.8 | 6.4 | 1.0 |

TABLE 11

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 10 | 1.7 | 7.5E+17 | Pt | Vacuum deposition | 5.30 | 6.9 | 5.6 | 3.0 |
| | 1.5 | 1.2E+18 | | | | 7 | 6.4 | 3.0 |
| | 1.4 | 2.0E+18 | | | | 7 | 5.3 | 3.0 |
| | 1.3 | 5.2E+18 | | | | 7.5 | 7.8 | 2.5 |

TABLE 11-continued

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
|  | 1.1 | 9.3E+18 |  |  |  | 8.1 | 4.3 | 2.5 |
|  | 1.0 | 1.5E+19 |  |  |  | 8.3 | 6.5 | 2.0 |
|  | 0.9 | 4.1E+19 |  |  |  | 9.5 | 4.1 | 1.0 |

TABLE 12

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 11 | 1.7 | 7.5E+17 | Au | Coating | 4.95 | 7.6 | 4.2 | 1.0 |
|  | 1.5 | 1.2E+18 |  |  |  | 7.6 | 3.9 | 1.0 |
|  | 1.4 | 2.0E+18 |  |  |  | 7.7 | 3.7 | 1.0 |
|  | 1.3 | 5.2E+18 |  |  |  | 8.1 | 3.1 | 1.0 |
|  | 1.1 | 9.3E+18 |  |  |  | 8.6 | 2.6 | 0.0 |
|  | 1.0 | 1.5E+19 |  |  |  | 8.9 | 2.1 | 0.0 |
|  | 0.9 | 4.1E+19 |  |  |  | 10.1 | 2.4 | 0.0 |

TABLE 13

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 12 | 1.7 | 7.5E+17 | Pt | Coating | 5.40 | 6.1 | 4.7 | 3.0 |
|  | 1.5 | 1.2E+18 |  |  |  | 6.8 | 3.2 | 3.0 |
|  | 1.4 | 2.0E+18 |  |  |  | 6.9 | 5.1 | 2.5 |
|  | 1.3 | 5.2E+18 |  |  |  | 7.1 | 2.8 | 2.5 |
|  | 1.1 | 9.3E+18 |  |  |  | 7.5 | 3.6 | 2.5 |
|  | 1.0 | 1.5E+19 |  |  |  | 8.4 | 7.1 | 1.5 |
|  | 0.9 | 4.1E+19 |  |  |  | 8.7 | 5.6 | 0.5 |

TABLE 14

|  | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Comp. Ex. 2 | 1.9 | 5.9E+16 | Au | Vacuum deposition | 4.77 | 0.2 | 0.03 | 3.0 |
|  | 1.7 | 7.5E+17 |  |  |  | 1.8 | 0.9 | −0.5 |
|  | 1.5 | 1.2E+18 |  |  |  | 2.3 | 1.2 | −1.0 |
|  | 1.4 | 2.0E+18 |  |  |  | 2.5 | 1.4 | −3.0 |
|  | 1.3 | 5.2E+18 |  |  |  | 3.4 | 0.7 | −4.0 |
|  | 1.1 | 9.3E+18 |  |  |  | 5.8 | 0.1 | −5.0 |
|  | 1.0 | 1.5E+19 |  |  |  | 6.2 | 0.04 | −9.0 |
|  | 0.9 | 4.1E+19 |  |  |  | — | 0.00006 | — |

Tables 8 to 14 depict the film forming conditions of the oxide semiconductor films formed in Examples 7 to 12 and Comparative Example 2, the carrier density of the oxide semiconductor films, types of source and drain electrodes, the forming methods of the source and drain electrode, the work functions of the metal films formed in the same manner as the source and drain electrodes, and the transistor characteristics of the field-effect transistors.

Examples 7 to 12 show the results when Au, Ag, or Ag/Pd, formed by coating, or Pt formed by vacuum deposition is used as source and drain electrodes. It could be understood from the results of the transistor characteristics depicted in Tables 8 to 13 that a high field-effect mobility, a high on/off ratio, and a small absolute value of the turn-on voltage were attained with the electron carrier density in the range of $4.0 \times 10^{17}$ cm$^{-3}$ to $4.0 \times 10^{19}$ cm$^{-3}$. Since the electron carrier density of the oxide semiconductor was high, contact resistance between the metal and the oxide semiconductor was not large at the contact interface, and therefore the desirable device properties were exhibited.

The transistor using Au formed by coating had a high on/off ratio, and normally-off transistor properties where a small absolute value of the turn-on voltage even with the oxide semiconductor having the electron carrier density of $4.0 \times 10^{18}$ cm$^{-3}$ or greater. This is because the work function of Au formed by coating is higher than the work function of Au formed by vacuum deposition.

On the other hand, the results of Comparative Example 2 with the electron carrier density (concentration) of $5.9 \times 10^{16}$ cm$^{-3}$ show the results of a transistor using a n-type oxide semiconductor, which has the carrier density close to the electron carrier density (concentration) of $1 \times 10^{15}$ cm$^{-3}$ to $1 \times 10^{16}$ cm$^{-3}$, which is typically suitably used, and gold formed by vacuum deposition is used as source and drain electrodes. In this case, the mobility is low. This is because Schottky barrier junction is formed at a plane where the gold having a relatively high work function and the n-type oxide semiconductor are in contact, and thus contact resistance becomes large.

Other than above, Comparative Example 2 shows the results of the transistor using the n-type oxide semiconductor with electron carrier density of $4.0 \times 10^{17}$ cm$^{-3}$ or greater, and gold formed by vacuum deposition is used as source and drain electrode. In the case where the electron carrier density is in the range of $4.0 \times 10^{17}$ cm$^{-3}$ or greater but less than or equal to $2.0 \times 10^{18}$ cm$^{-3}$, transistor properties that the field-effect mobility is high, an on/off ratio is high, and an absolute value of the turn-on voltage is small are obtained. However, the turn-on voltage is negative, that means it is not normally-off operation. When the electron carrier density is equal to or greater than the aforementioned range (the electron carrier density is $5.2 \times 10^{18}$ cm$^{-3}$ or greater), the on/off ratio tends to be smaller than those of Examples 7 to 12, and the absolute value of the turn-on voltage tends to be large. This tendency becomes significant with the electron carrier density of $1.0 \times 10^{19}$ cm$^{-3}$ or greater.

Example 13

A bottom gate/top contact field-effect transistor was produced in the same manner as in Example 1, provided that the formation of the active layer was changed to the following method. Moreover, the evaluations were carried out in the same manner as in Example 1. The results are depicted in Table 15.

—Formation of Active Layer—

On the formed insulating layer, a Zn—Sn based oxide thin film was formed by radio frequency sputtering. As for a target, a polycrystalline sintered compact (size: 4 inches in diameter) having a composition of $Zn_2SnO_4$ was used. The back pressure in the sputtering chamber was set to $2 \times 10^{-5}$ Pa. An amount of oxygen in the oxide semiconductor film could be controlled by adjusting flow rates of argon gas and oxygen gas supplied during the sputtering, to thereby control the electron carrier density. The total pressure was set to 0.3 Pa.

During the sputtering, the temperature of the substrate was controlled in the region of 15° C. to 35° C. by cooling a holder holding the substrate with water. The sputtering power was set to 150 W, and the sputtering duration was set to 20 minutes, to thereby form a Zn—Sn based oxide film having a thickness of 50 nm. The oxygen flow rate during the sputtering is depicted in Table 15.

TABLE 15

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 13 | 50 | 7.5E+18 | Au | Coating | 4.91 | 7.3 | 5.8 | 0.5 |

Example 14

A bottom gate/top contact field-effect transistor was produced in the same manner as in Example 1, provided that the formation of the active layer was changed to the following method. Moreover, the evaluations were carried out in the same manner as in Example 1. The results are depicted in Table 16.

—Formation of Active Layer—

On the formed insulating layer, a Zn—Ti based oxide thin film was formed by radio frequency sputtering. As for a target, a polycrystalline sintered compact (size: 4 inches in diameter) having a composition of $Zn_2TiO_4$ was used. The back pressure in the sputtering chamber was set to $2 \times 10^{-5}$ Pa. An amount of oxygen in the oxide semiconductor film could be controlled by adjusting flow rates of argon gas and oxygen gas supplied during the sputtering, to thereby control the electron carrier density. The total pressure was set to 0.3 Pa.

During the sputtering, the temperature of the substrate was controlled in the region of 15° C. to 35° C. by cooling a holder holding the substrate with water. The sputtering power was set to 140 W, and the sputtering duration was set to 25 minutes, to thereby form a Zn—Ti based oxide film having a thickness of 50 nm. The oxygen flow rate during the sputtering is depicted in Table 16.

TABLE 16

| | Film coating condition, oxygen flow rate (vol %) | Carrier density n (cm$^{-3}$) | Source-drain electrode | Film forming method | Work function (eV) | Carrier mobility μFE (cm$^2$/Vs) | On/off ratio (×10$^8$) | Turn-on voltage (V) |
|---|---|---|---|---|---|---|---|---|
| Ex. 14 | 50 | 8.3E+18 | Au | Coating | 4.91 | 7.6 | 4.8 | 1.0 |

Examples 15 to 17

Each bottom gate/top contact field-effect transistor was produced in the same manner as in Example 1, provided that the formation of the active layer and the production of the element for hall effect measurement were changed to the following methods. Moreover, the evaluations were carried out in the same manner as in Example 1. The results are depicted in Table 18.
—Formation of Active Layer—

In a beaker, 3.55 g of indium nitrate (In(NO$_3$)$_3$.3H$_2$O) and 0.139 g of strontium chloride (SrCl$_2$.6H$_2$O) were weighed. To this, 20 mL of 1,2-propanediol, and 20 mL of ethylene glycol monomethyl ether was added, and the resultant was mixed at room temperature to dissolve, to thereby produce Coating Liquid 1 for forming an n-type oxide semiconductor film used in Example 15.

In the similar manner, 3.55 g of indium nitrate (In(NO$_3$)$_3$.3H$_2$O) and 0.125 g of calcium nitrate (Ca(NO$_3$)$_2$.4H$_2$O) were weighed in a beaker. To this, 20 mL of 1,2-propanediol and 20 mL of ethylene glycol monomethyl ether were added, and the resultant was mixed at room temperature to dissolve, to thereby produce Coating Liquid 2 for forming an n-type oxide semiconductor film used in Example 16.

In the similar manner, 3.55 g of indium nitrate (In(NO$_3$)$_3$.3H$_2$O) and 0.125 g of barium chloride (BaCl$_2$.2H$_2$O) were weighed in a beaker. To this, 20 mL of 1,2-ethanediol, and 20 mL of ethylene glycol monomethyl ether were added, and the resultant was mixed at room temperature to dissolve, to thereby produce Coating Liquid 3 for forming an n-type oxide semiconductor film used in Example 17.

On the formed insulating layer, each of Coating Liquids 1 to 3 for forming a n-type oxide semiconductor film was applied into the predetermined pattern by means of an inkjet device. After drying the substrate for 10 minutes on the hot plate heated at 120° C., the applied coating liquid was baked in the air for 1 hour at 400° C., to thereby form an In—Sr based oxide film, an In—Ca based oxide film, and an In—Ba based oxide film, respectively. The formed films were each used as an active layer.

The composition of the coating liquid for forming a n-type oxide semiconductor film is depicted in Table 17.

TABLE 17

| | Active layer | Raw material A | | Raw material B | | Raw material C | | Raw material D | |
|---|---|---|---|---|---|---|---|---|---|
| | | Type | (g) | Type | (g) | Type | (mL) | Type | (mL) |
| Ex. 15 | In—Sr based oxide | Indium nitrate | 3.55 | Strontium chloride | 0.139 | 1,2-propane diol | 20 | Ethylene glycol monomethyl ether | 20 |
| Ex. 16 | In—Ca based oxide | Indium nitrate | 3.55 | Calcium nitrate | 0.125 | 1,2-propane diol | 20 | Ethylene glycol monomethyl ether | 20 |
| Ex. 17 | In—Ba based oxide | Indium nitrate | 3.55 | Barium chloride | 0.125 | 1,2-ethane diol | 20 | Ethylene glycol monomethyl ether | 20 |

<Production of Element for Hall Effect Measurement>
—Formation of n-Type Oxide Semiconductor Film—

In the same manner as in the aforementioned formation of the active layer of the field-effect transistor, each of Coating Liquids 1 to 3 for forming a n-type oxide semiconductor film was applied on a glass substrate into a square pattern having a side of 8 mm by means of an inkjet device. After heating the substrate for 10 minutes on the hot plate heated at 120° C., the applied coating liquid was baked in the air for 1 hour at 400° C., to thereby form an In—Sr based oxide film, an In—Ca based oxide film, and an In—Ba based oxide film, respectively.

—Formation of Contact Electrode—

A contact electrode for hall effect measurement was formed on the glass substrate, on which the In—Sr based oxide film, the In—Ca based oxide film, or the In—Ba based oxide had been formed, by vacuum deposition using a shadow mask. As for a deposition source, Al was used.

TABLE 18

|  | Carrier density n ($cm^{-3}$) | Source-drain electrode | Film forming method | Work function (eV) | Carrier mobility μFE ($cm^2/Vs$) | On/off ratio (×$10^8$) | Turn-on voltage (V) |
|---|---|---|---|---|---|---|---|
| Ex. 15 | 6.1E+18 | Au | Coating | 4.91 | 6.3 | 4.8 | 0.5 |
| Ex. 16 | 5.4E+18 | Au | Coating | 4.91 | 5.5 | 2.5 | 1.0 |
| Ex. 17 | 5.1E+18 | Au | Coating | 4.91 | 4.9 | 6.8 | 0.5 |

Tables 15 to 16 depict the film forming conditions of the oxide semiconductor films formed in Examples 13 to 14, the carrier density of the oxide semiconductor films, types of source and drain electrodes, the forming methods of the source and drain electrode, the work functions of the metal films formed in the same manner as the source and drain electrodes, and the transistor characteristics of the field-effect transistors. Table 18 depict the carrier density of the oxide semiconductor films formed in Examples 15 to 17, types of source and drain electrodes, the forming methods of the source and drain electrode, the work functions of the metal films formed in the same manner as the source and drain electrodes, and the transistor characteristics of the field-effect transistors.

Examples 13 to 17 show the results when Au formed by coating is used as source and drain electrode. From the transistor characteristics depicted in Tables 15 to 16 and 18, it could be understood that the normally-off transistor operation of a high field-effect mobility, a high on/off ratio, and a small absolute value of the turn-on voltage was attained with the electron carrier density in the range of $5.1 \times 10^{18}$ $cm^{-3}$ to $8.3 \times 10^{18}$ $cm^{-3}$. Since the electron carrier density of the oxide semiconductor was high, contact resistance between the metal and the oxide semiconductor was not large at the contact interface, and therefore the desirable device properties were exhibited.

Example 18

Production of Field-Effect Transistor

—Formation of Gate Electrode—

On a glass substrate, Al was deposited to have a thickness of 100 nm through vapor deposition, followed by patterning into a line through photolithography and etching, to thereby form a gate electrode.

—Formation of Gate Insulating Layer—

Next, a film of $SiO_2$ was formed to have a thickness of 200 nm by plasma CVD, to thereby form a gate insulating film.

—Formation of Active Layer—

On the formed insulating layer, a Mg—In based oxide semiconductor film (active layer) was formed by sputtering in the method described in Examples of JP-A No. 2010-74148. As for a target, a polycrystalline sintered compact having a composition of $In_2MgO_4$ was used. The back pressure in the sputtering chamber was set to $2 \times 10^{-5}$ Pa. The total pressure was set to 0.3 Pa by adjusting flow rates of argon gas and oxygen gas supplied during the sputtering. An amount of oxygen in the oxide semiconductor film and the electron carrier density were controlled by adjusting the flow rate of the oxygen gas. The oxygen flow rate during the sputtering is depicted in Table 19.

A thickness of the obtained oxide semiconductor film (active layer) was 50 nm.

—Formation of Source Electrode and Drain Electrode—

On the formed active layer, a gold nanometal ink (Au-1Chb, manufactured by ULVAC, Inc., the average particle diameter: 5 nm, the metal content: 50% by mass) was applied into the predetermined pattern by means of an inkjet device. The applied ink was heated in the air for 30 minutes at 300° C., to form a source electrode and a drain electrode each having a thickness of 100 nm. A channel width was 400 μm, and a channel length specified with a length between the source electrode and the drain electrode was 50 μm.

In the manner as described above, a bottom gate/top contact field-effect transistor was produced.

—Production of Element Used for Work Function Measurement—

In order to measure work function, an element used for work function measurement was obtained by forming a metal film on a glass substrate in the same manner as in the formation of the source electrode and drain electrode.

<Production of Element for Hall Effect Measurement>
—Formation of n-Type Oxide Semiconductor Film—

In the same manner as in the aforementioned formation of the active layer of the field-effect transistor, a square pattern of a n-type oxide semiconductor having a side of 8 mm was formed on a glass substrate through a shadow mask. The conditions for the sputtering were set the same as in the formation of the active layer. The conditions for sputtering are depicted in Table 19.

—Formation of Contact Electrode—

A contact electrode for hall effect measurement was formed on the glass substrate, on which the n-type oxide semiconductor film had been formed, by vacuum deposition using a shadow mask. As for a deposition source, Al was used.

<Evaluation of Electron Carrier Density (Concentration)>

The element for hall effect measurement was subjected to the measurements of specific resistance and hall effect by means of a hall effect measurement system (ResiTest8300, manufactured by TOYO Corporation), to thereby determined an electron carrier density of ($cm^{-3}$) the n-type oxide semiconductor. The obtained electron carrier density (concentration) is depicted in Table 19.

<Evaluation of Work Function>

The work function of the metal film of the element for work function measurement was determined by means of a photoelectron spectrometer in air AC-2 (manufactured by RIKEN KEIKI Co., Ltd.). The obtained work function is depicted in Table 19.

<Evaluation of Transistor Performance>

Figure 21:
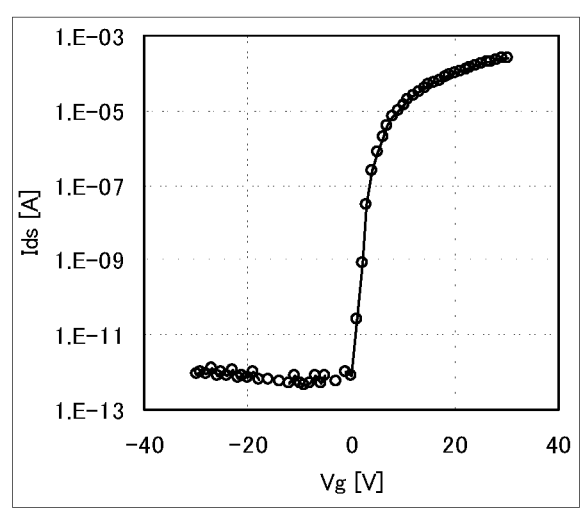
FIG. 21 is a diagram depicting current-voltage characteristics of the field-effect transistor of Example 18 with the carrier density of $5.2 \times 10^{18}$ cm$^{-3}$.

An evaluation of transistor performance was performed on the obtained field-effect transistor by means of a semiconductor parameter analyzer (Semiconductor Parameter Analyzer 4156C, manufactured by Agilent Technologies, Inc.). Current-voltage characteristics were evaluated by setting the source-drain voltage Vds to 20 V, and varying the gate voltage Vg from −30 V to +30 V. FIG. 21 depicts the measured current-voltage characteristics (transmission characteristics). The field-effect mobility was calculated in the saturated region. Moreover, a ratio (on/off ratio) of the source-drain current Ids of the transistor in the "on" state (e.g., Vg=20 V) to that in the "off" state (e.g., Vg=−20 V) was calculated. Moreover, the gate voltage (turn-on voltage), with which the source-drain current Ids turned to increase was calculated. The results are depicted in Table 19.

Figure 22:
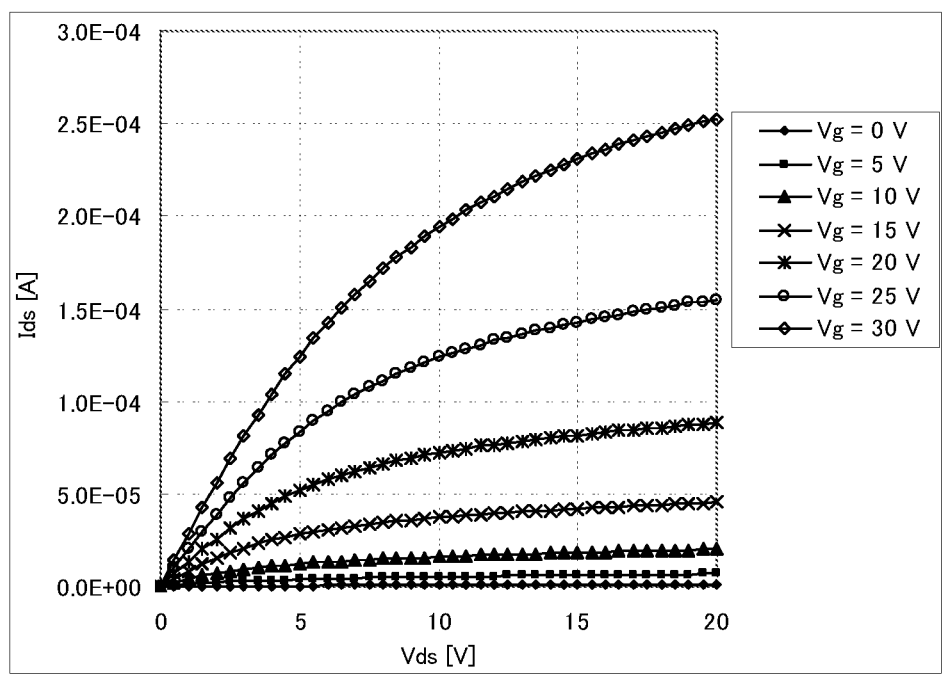
FIG. 22 is a diagram depicting current-voltage characteristics of the field-effect transistor of Example 18 with the carrier density of $5.2 \times 10^{18}$ cm$^{-3}$.

Moreover, the current-voltage characteristics (output characteristics) were evaluated by varying the gate voltage Vg from 0 V to +30 V stepwise by 5 V, and varying the source-drain voltage Vds from 0V to +20 V at each gate voltage. FIG. 22 depicts the measured current-voltage characteristics (output characteristics).

Comparative Example 3

Figure 23:
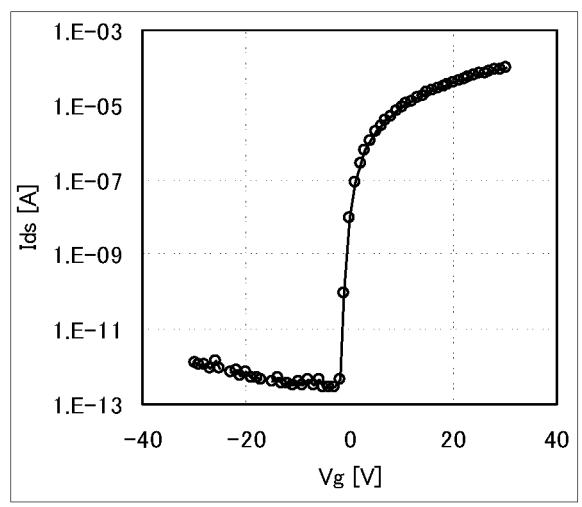
FIG. 23 is a diagram depicting current-voltage characteristics of the field-effect transistor of Comparative Example 3 with the carrier density of $5.7 \times 10^{15}$ cm$^{-3}$.
Figure 24:
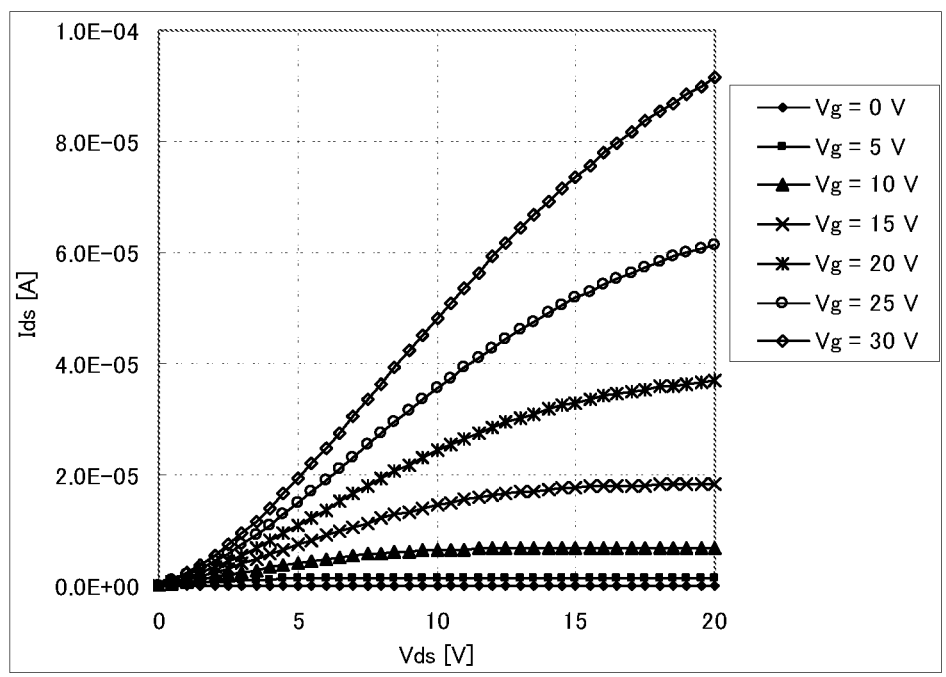
FIG. 24 is a diagram depicting current-voltage characteristics of the field-effect transistor of Comparative Example 3 with the carrier density of $5.7\times10^{15}$ cm$^{-3}$.

A bottom gate/top contact field-effect transistor was produced in the same manner as in Example 18, provided that the formation of the active layer, and the formation of the source electrode and drain electrode were changed to the following methods. Moreover, the evaluations were carried out in the same manner as in Example 18. The results are depicted in Table 19. Moreover, FIG. 23 depicts the current-voltage characteristics (transmission characteristics) thereof, and FIG. 24 depicts the current-voltage characteristics (output characteristics) thereof.

—Formation of Active Layer—

On the formed source electrode and drain electrode as well as the gate insulating layer, a Mg—In based oxide semiconductor film (active layer) was formed by sputtering in the method described in JP-A No. 2010-74148. As for a target, a polycrystalline sintered compact having a composition of $In_2MgO_4$. The back pressure in the sputtering chamber was set to $2 \times 10^{-5}$ Pa. The total pressure was set to 0.3 Pa by adjusting flow rates of argon gas and oxygen gas supplied during the sputtering. An amount of oxygen in the oxide semiconductor film and the electron carrier density were controlled by adjusting the flow rate of the oxygen gas. The oxygen flow rate during the sputtering is depicted in Table 19.

A thickness of the obtained oxide semiconductor film (active layer) was 50 nm.

—Formation of Source Electrode and Drain Electrode—

On the formed active layer, a source electrode and a drain electrode each having a thickness of 100 nm were formed by vacuum deposition. As for the deposition source, Al was used. A channel width was 400 μm, and a channel length was 50 μm.

TABLE 19

| | Film coating condition, oxygen flow rate (vol %) | Carrier density n ($cm^{-3}$) | Source-drain electrode | Film forming method | Work function (eV) | Carrier mobility μFE ($cm^2/Vs$) | On/off ratio ($\times 10^8$) | Turn-on voltage (V) |
|---|---|---|---|---|---|---|---|---|
| Ex. 18 | 0.80 | 5.2E+18 | Au | Coating | 4.91 | 6.4 | 1.5 | 0.5 |
| Comp. Ex. 3 | 50 | 5.7E+15 | Al | Vacuum deposition | 4.30 | 2.3 | 0.61 | −2.0 |

Table 19 depicts the film forming conditions of the oxide semiconductor films formed in Example 18 and Comparative Example 3, the carrier density of the oxide semiconductor films, types of source and drain electrodes, the forming methods of the source and drain electrode, the work functions of the metal films formed in the same manner as the source and drain electrodes, and the transistor characteristics of the field-effect transistors.

It can be confirmed from the current-voltage characteristics (output characteristics) depicted in FIG. 22 that the value of the source-drain current is linearly increased in the region where the value of the source-drain voltage is small. It can be assumed from this result that the contact interface between the metal and oxide semiconductor is an ohmic contact.

From the current-voltage characteristics (transmission characteristics) depicted in FIG. 21, and the results of the transistor characteristics of Example 18 depicted in Table 19, it was found that, when the electron carrier density was $5.2 \times 10^{18}$ $cm^{-3}$, normally off transistor characteristics where the field-effect mobility was high, the on/off ratio was high, and the absolute value of the turn-on voltage was small was obtained.

Since the electron carrier density of the oxide semiconductor was high, contact resistance between the metal and the oxide semiconductor was not large at the contact interface, and therefore the desirable device properties were exhibited.

Use of the transistor having the current-voltage characteristics (output characteristics) as in FIG. 22 as a driving circuit is preferable, because designing of driving voltage becomes easy.

On the other hand, it could be confirmed from the current-voltage characteristics (output characteristics) of Comparative Example 3 depicted in FIG. 24 that the source-drain current was non-linearly increased in the shape of a concave in the region where the value of the source-drain voltage was small.

In the case where the electron carrier density of the oxide semiconductor is $5.7 \times 10^{15}$ $cm^{-3}$, as depicted in Table 19 and FIG. 23, the transistor characteristics that the field-effect mobility is high, the on/off ratio is high, and the absolute value of the turn-on voltage is low can be attained by using Al, which is a metal having low work function, as source and drain electrodes.

However, FIG. 24 shows that the contact resistance at the contact interface between the metal and the oxide semiconductor depends on the voltage, and it is assumed that the contact interface of the metal and the oxide semiconductor is a non-ohmic contact. When the transistor having the current-voltage characteristics as depicted in FIG. 24 is used as a driving circuit, current is largely changed with a slight change in the voltage applied to the transistor, and therefore it is difficult to apply the transistor as the driving circuit. By using a metal having low work function for source and drain electrode, and controlling the electron carrier density of oxide semiconductor in the range of $1 \times 10^{15}$ cm$^{-3}$ to $1 \times 10^{16}$ cm$^{-3}$, the transistor characteristics that the field-effect mobility is high, the on/off ratio is high, and the absolute value of the turn-on voltage is small can be attained. On the other hand, however, the contact interface between the metal and oxide semiconductor becomes a non-ohmic contact, and therefore it is difficult to apply to a driving circuit.

It can be understood from the results of Example 18 and Comparative Example 3 that the field-effect transistor of the present invention can be easily applied as a driving circuit of a display element, compared to a conventional field-effect transistor using oxide semiconductor having the electron carrier density (concentration) of $1 \times 10^{15}$ cm$^{-3}$ to $1 \times 10^{16}$ cm$^{-3}$, which is typically suitable used as a n-type oxide semiconductor of a transistor, and a metal having low work function for source and drain electrodes.

The embodiments of the present invention are, for example, as follows:

<1> A field-effect transistor, containing:
a gate electrode configured to apply gate voltage;
a source electrode and a drain electrode, both of which are configured to take out electric current;
an active layer formed of a n-type oxide semiconductor, provided in contact with the source electrode and the drain electrode; and
a gate insulating layer provided between the gate electrode and the active layer,
wherein work function of the source electrode and drain electrode is 4.90 eV or greater, and
wherein an electron carrier density of the n-type oxide semiconductor is $4.0 \times 10^{17}$ cm$^{-3}$ or greater.

<2> The field-effect transistor according to <1>, wherein a material of the source electrode and the drain electrode is a metal, an alloy, or both.

<3> The field-effect transistor according to <2>, wherein the metal, the alloy, or both contain gold, silver, palladium, platinum, nickel, iridium, rhodium, or any combination thereof.

<4> The field-effect transistor according to any one of <1> to <3>, wherein the source electrode and the drain electrode are formed by baking metal particles, alloy particles, an organometallic compound, or any combination thereof.

<5> The field-effect transistor according to <4>, wherein the source electrode and the drain electrode are formed by applying a coating liquid containing metal particles, alloy particles, an organometallic compound, or any combination thereof in a droplet ejecting system, and baking the metal particles, the alloy particles, the organometallic compound, or any combination thereof.

<6> The field-effect transistor according to any one of <1> to <5>, wherein the n-type oxide semiconductor contains indium, zinc, tin, gallium, titanium, or any combination thereof.

<7> The field-effect transistor according to <6>, wherein the n-type oxide semiconductor further contains an alkaline earth metal.

<8> A method for producing the field-effect transistor according to any one of <1> to <7>, the method containing:
applying a coating liquid containing metal particles, alloy particles, an organometallic compound, or any combination thereof at least on the gate insulating layer, and baking the metal particles, the alloy particles, the organometallic compound, or any combination thereof to form the source electrode and the drain electrode.

<9> A method for producing the field-effect transistor according to any one of <1> to <7>, the method containing:
applying a coating liquid containing metal particles, alloy particles, an organometallic compound, or any combination thereof at least on a base, and baking the metal particles, the alloy particles, the organometallic compound, or any combination thereof to form the source electrode and the drain electrode.

<10> The method according to any of <8> or <9>, wherein the metal particles, the alloy particles, the organometallic compound, or any combination thereof contain gold, silver, palladium, platinum, nickel, iridium, rhodium, or any combination thereof.

<11> A display element, containing:
a light control element configured to control light output according to a driving signal; and
a driving circuit, which contains the field-effect transistor according to any one of <1> to <7>, and is configured to drive the light control element.

<12> The display element according to <11>, wherein the light control element contains an electroluminescent element or an electrochromic element.

<13> The display element according to <11>, wherein the light control element contains a liquid crystal element, or an electrophoretic element.

<14> An image display device, which displays an image corresponding to image data, and which containing:
a plurality of the display elements according to any one of <11> to <13>, arranged in a matrix;
a plurality of lines configured to separately apply gate voltage to field-effect transistors in each of the display elements; and
a display control device configured to individually control the gate voltage of each of the field-effect transistors through the lines corresponding to the image data.

<15> A system, containing:
the image display device according to <14>; and
an image data generating device configured to generate an image data based on image information to be displayed, and to output the generated image data to the image display device.

REFERENCE SIGNS LIST 1 base
2 gate electrode
3 gate insulating layer
4 source electrode
5 drain electrode
6 active layer
10 field-effect transistor
20 field-effect transistor
21 base
22 active layer
23 source electrode
24 drain electrode 25 gate insulating layer
26 gate electrode
30 capacitor
40 field-effect transistor
100 television device
101 main control device
103 tuner
104 AD converter (ADC)
105 demodulating circuit
106 TS (Transport Stream) decoder
111 sound decoder
112 DA converter (DAC)
113 sound output circuit
114 speaker
121 image decoder
122 image-OSD synthesis circuit
123 image output circuit
124 image display device
125 OSD drawing circuit
131 memory
132 operating device
141 drive interface (drive IF)
142 hard disk device
143 optical disk device
151 IR photodetector
152 communication control unit
210 aerial
220 remote-controlled transmitter
300 display unit
302, 302' display element
310 display
312 cathode
314 anode
320, 320' driving circuit
340 organic EL thin film layer
342 electron transporting layer
344 light emitting layer
346 hole transporting layer
350 organic EL element
360 interlayer insulating film
361 capacitor
370 liquid crystal element
400 display control device
402 image data processing circuit
404 scanning line driving circuit
406 data line driving circuit

The invention claimed is:

1. A field-effect transistor, comprising:
a gate electrode;
a source electrode and a drain electrode, each formed by a conductive material;
a n-type oxide semiconductor, provided in contact with the source electrode and the drain electrode; and
a gate insulating layer provided between the gate electrode and the n-type oxide semiconductor, wherein
a work function of the source electrode and the drain electrode formed by the conductive material is 4.90 eV or greater, and,
in a case that an electron carrier density of the n-type oxide semiconductor is $4.0 \times 10^{18}$ cm$^{-3}$ or greater, a carrier mobility of the field-effect transistor is at least 3.8 cm$^2$/Vs and an ON/OFF ratio of a drain-source current is $1.0 \times 10^8$ or greater between an OFF state in which a gate voltage is −20 V and an ON state in which the gate voltage is 20 V.

2. The field-effect transistor according to claim 1, wherein the conductive material of the source electrode and the drain electrode is a metal, an alloy, or both.

3. The field-effect transistor according to claim 2, wherein the metal, the alloy, or both contain gold, silver, palladium, platinum, nickel, iridium, rhodium, or any combination thereof.

4. The field-effect transistor according to claim 1, wherein the source electrode and the drain electrode are formed by baking metal particles, alloy particles, an organometallic compound, or any combination thereof.

5. The field-effect transistor according to claim 1, wherein the n-type oxide semiconductor contains indium, zinc, tin, gallium, titanium, or any combination thereof.

6. The field-effect transistor according to claim 5, wherein the n-type oxide semiconductor further contains an alkaline earth metal.

7. A display element, comprising:
a light control element configured to control light output according to a driving signal; and
a driving circuit, which contains the field-effect transistor according to claim 1 and is configured to drive the light control element.

8. The display element according to claim 7, wherein the light control element contains an electroluminescent element or an electrochromic element.

9. The display element according to claim 7, wherein the light control element contains a liquid crystal element or an electrophoretic element.

10. An image display device, which displays an image corresponding to image data, the image display device comprising:
a plurality of display elements according to claim 7 arranged in a matrix;
a plurality of lines configured to separately apply a respective gate voltage to field-effect transistors in each of the plurality of display elements; and
a display control device configured to individually control the respective gate voltage of each of the field-effect transistors through the lines corresponding to the image data.

11. A system, comprising:
the image display device according to claim 10; and
an image data generating device configured to generate image data based on image information to be displayed, and output the generated image data to the image display device.

12. The field-effect transistor according to claim 1, wherein each of the source electrode and the drain electrode is a thin film electrode formed by the conductive material, and the work function of the thin film electrode formed by the conductive material is 4.90 eV or greater.

13. The field-effect transistor according to claim 1, wherein each of the source electrode and the drain electrode is a thin film electrode formed by the conductive material, and the work function of the thin film electrode formed by the conductive material is 4.90 eV or greater and is 6.00 eV or less.

14. The field-effect transistor according to claim 1, wherein each of the source electrode and the drain electrode is a thin film electrode formed by the conductive material, and the work function of the thin film electrode formed by the conductive material is 4.90 eV or greater, to prevent the thin film electrode from being oxidized by a heat treatment or oxidizing atmosphere treatment performed after the field-effect transistor has been formed.

* * * * *